(12) United States Patent
Park et al.

(10) Patent No.: US 12,288,776 B2
(45) Date of Patent: Apr. 29, 2025

(54) DISPLAY DEVICE

(71) Applicant: Samsung Display Co., LTD., Yongin-si (KR)

(72) Inventors: Yun Hee Park, Yongin-si (KR); Young Gu Kim, Yongin-si (KR); Ji Yun Park, Yongin-si (KR); Suk Kung Chei, Yongin-si (KR); Kyung Seon Tak, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 506 days.

(21) Appl. No.: 17/669,853

(22) Filed: Feb. 11, 2022

(65) Prior Publication Data

US 2023/0028682 A1 Jan. 26, 2023

(30) Foreign Application Priority Data

Jul. 26, 2021 (KR) .......................... 10-2021-0098159

(51) Int. Cl.
*H10H 20/851* (2025.01)
*H01L 25/16* (2023.01)
*H10H 20/01* (2025.01)
*H10H 20/80* (2025.01)

(52) U.S. Cl.
CPC ....... *H01L 25/167* (2013.01); *H10H 20/0361* (2025.01); *H10H 20/8515* (2025.01); *H10H 20/882* (2025.01)

(58) Field of Classification Search
CPC . H01L 25/167; H01L 25/0753; H01L 25/156; H01L 33/507; H01L 33/44; H01L 33/50; H01L 33/58; H10K 59/88; G02B 1/10; G02B 5/201; G02B 5/223; G09G 2300/0413; G09G 2300/0439
See application file for complete search history.

(56) References Cited

U.S. PATENT DOCUMENTS

| | | |
|---|---|---|
| 2017/0194397 A1* | 7/2017 | Kim ...................... H10K 59/127 |
| 2020/0013834 A1 | 1/2020 | Park et al. |
| 2020/0152705 A1* | 5/2020 | Son ........................ H10K 59/35 |
| 2021/0028236 A1 | 1/2021 | Kim et al. |
| 2021/0202587 A1 | 7/2021 | Kim et al. |
| 2022/0375996 A1 | 11/2022 | Kim et al. |

FOREIGN PATENT DOCUMENTS

KR 10-2022-0156719 11/2022

* cited by examiner

*Primary Examiner* — Amar Movva
*Assistant Examiner* — Sandra Milena Rodriguez Villan
(74) *Attorney, Agent, or Firm* — KILE PARK REED & HOUTTEMAN PLLC

(57) ABSTRACT

The display device includes sub-pixels disposed in a display area, dummy pixels disposed in a non-display area, a first bank disposed at a boundary between the sub-pixels and including an opening, a second bank disposed at a boundary between the dummy pixels and including an opening, a color conversion layer disposed in the opening of the first bank, and an organic layer disposed in the opening of the second bank.

12 Claims, 18 Drawing Sheets

DISPLAY DEVICE

CROSS-REFERENCE TO RELATED APPLICATION(S)

This application claims priority to and benefits of Korean Patent Application No. 10-2021-0098159 under 35 U.S.C. § 119, filed on Jul. 26, 2021 in the Korean Intellectual Property Office, the entire contents of which are herein incorporated by reference.

BACKGROUND

1. Technical Field

The disclosure relates to a display device.

2. Description of the Related Art

As interest in information display is increasing, research and development of display devices is continuously being conducted.

SUMMARY

An aspect of the disclosure is to provide a display device capable of minimizing cracks (one or more cracks) and a peeling phenomenon of a display panel, particularly an optical layer.

Aspects are not limited to the above-described aspect, and other technical aspects which are not described will be clearly understood by those skilled in the art from the following description.

According to an embodiment, a display device may include sub-pixels disposed in a display area, dummy pixels disposed in a non-display area, a first bank disposed at a boundary between the sub-pixels and including an opening, a second bank disposed at a boundary between the dummy pixels and including an opening, a color conversion layer disposed in the opening of the first bank, and an organic layer disposed in the opening of the second bank.

A thickness of the organic layer may be less than a thickness of the color conversion layer.

A difference between a thickness of the second bank and a thickness of the organic layer may be about 5 μm or less.

Each of the sub-pixels may include a first electrode and a second electrode spaced apart from each other, and light emitting elements between the first electrode and the second electrode.

The color conversion layer may be disposed on the light emitting elements.

Each of the sub-pixels may include a first connection electrode disposed on first ends of the light emitting elements, and a second connection electrode disposed on second ends of the light emitting elements.

The sub-pixels may include a first pixel emitting a first color, a second pixel emitting a second color, and a third pixel emitting a third color.

The color conversion layer may include a first color conversion layer disposed in the first pixel, a second color conversion layer disposed in the second pixel, and a scattering layer disposed in the third pixel.

The organic layer and the scattering layer may include a same material.

The organic layer and the scattering layer may be disposed on a same layer.

At least one of the first color conversion layer and the second color conversion layer may include a base resin and a quantum dot dispersed in the base resin.

The display device may further include a dam disposed in the non-display area, wherein the dam may surround the display area.

The dam, the first bank, and the second bank may include a same material.

The display device may further include a pad area disposed in the non-display area, and the dam may be disposed between the dummy pixels and the pad area.

According to an embodiment, a display device may include sub-pixels disposed in a display area, dummy pixels disposed in a non-display area, a first bank disposed in the sub-pixels and including an opening, a second bank disposed in the dummy pixels and including an opening, the second bank and the first bank being disposed on a same layer, an organic layer disposed in the opening of the second bank, and an optical layer disposed on the organic layer.

The display device may further include a light-transmitting film disposed on the optical layer.

A refractive index of the optical layer may be in a range from about 1.1 to about 1.3.

The dummy pixels may include a first dummy pixel and a second dummy pixel, and the optical layer may cover the second dummy pixel, and the optical layer may expose the first dummy pixel.

The second dummy pixel may be disposed between the sub-pixels and the first dummy pixel.

The display device may further include a capping layer disposed between the organic layer and the optical layer.

Details of other embodiments are included in the detailed description and drawings.

According to an embodiment of the disclosure, even though rework of a light-transmitting film proceeds, as an organic layer may be provided in an opening of a second bank of the dummy pixels, a step difference due to the second bank may be minimized. Therefore, a peeling phenomenon may be minimized by preventing cracks from occurring in an optical layer due to a lower step difference in a rework process.

Effects according to embodiments are not limited by the contents illustrated above, and additional various effects are included in the specification.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
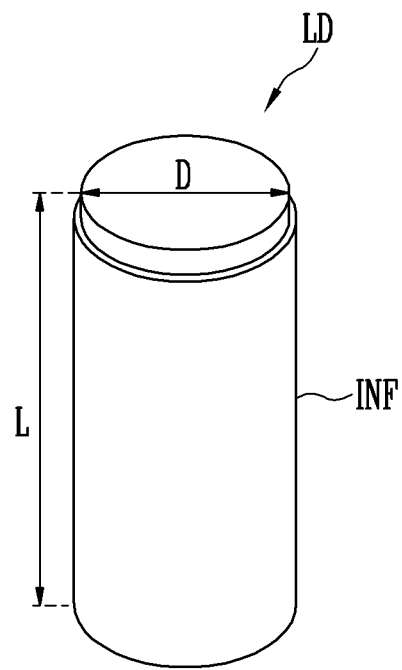
FIGS. 1 and 2 are schematic perspective and cross-sectional views illustrating a light emitting element according to an embodiment.

Hereinafter, embodiments of the disclosure are described in detail with reference to the accompanying drawings. Advantages and features of the disclosure and methods of achieving such will become apparent with reference to the embodiments described in detail below together with the accompanying drawings. However, the disclosure is not limited to the embodiments disclosed below, and may be implemented in various different forms. The embodiments are provided so that the disclosure will be thorough and complete and so that those skilled in the art to which the disclosure pertains can fully understand the scope of the disclosure.

The terminology used in the specification is for describing embodiments and is not intended to limit the disclosure. In the specification, the singular form also includes the plural form (and vice versa) unless otherwise specified. The terms "comprises", "has", "includes", and the like, do not exclude presence or addition of one or more other components, steps, operations, and/or elements to the described component, step, operation, and/or element.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

In addition, the term "coupling" or "connection" may collectively mean a physical and/or electrical coupling or connection. In addition, this may collectively mean a direct or indirect coupling or connection and an integral or non-integral coupling or connection.

A case in which an element or a layer is referred to as "on" another element or layer includes a case in which another layer or another element is disposed directly on the other element or between the other layers. The same reference numerals denote the same components throughout the specification.

Although a first, a second, and the like are used to describe various components, these components are not limited by these terms. These terms are used only to distinguish one component from another component. Therefore, a first component described below may be a second component and still within the spirit of the disclosure.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or "to not overlap" another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
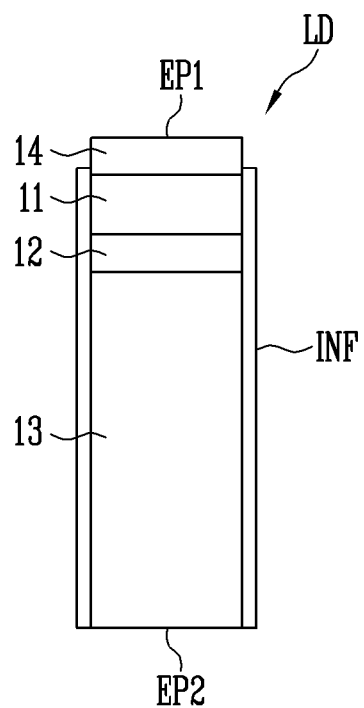

FIGS. 1 and 2 are schematic perspective and cross-sectional views illustrating a light emitting element according to an embodiment. FIGS. 1 and 2 show a column shape light emitting element LD, but a type and/or a shape of the light emitting element LD are/is not limited thereto.

Referring to FIGS. 1 and 2, the light emitting element LD may include a first semiconductor layer 11, an active layer 12, a second semiconductor layer 13, and/or an electrode layer 14.

The light emitting element LD may be formed in a column shape extending along a direction. The light emitting element LD may have a first end EP1 and a second end EP2. One of the first and second semiconductor layers 11 and 13 may be disposed at the first end EP1 of the light emitting element LD. The other of the first and second semiconductor layers 11 and 13 may be disposed at the second end EP2 of the light emitting element LD. For example, the first semiconductor layer 11 may be disposed at the first end EP1 of the light emitting element LD, and the second semiconductor layer 13 may be disposed at the second end EP2 of the light emitting element LD.

According to an embodiment, a light emitting element LD may be a light emitting element manufactured in a column shape through an etching method or the like. In the specification, the column shape includes a rod-like shape or a bar-like shape of which an aspect ratio may be greater than about 1, such as a circular column or a polygonal column, and the shape of the cross-section thereof is not limited.

The light emitting element LD may have a size as small as a nanometer scale to a micrometer scale. For example, each light emitting element LD may have a diameter D (or width) and/or a length L of a nanometer scale to micrometer scale range. However, a size of the light emitting element LD is not limited thereto, and the size of the light emitting element LD may be variously changed according to a design condition of various devices using a light emitting device using the light emitting element LD as a light source, for example, a display device or the like.

The first semiconductor layer 11 may be a semiconductor layer of a first conductivity type. For example, the first semiconductor layer 11 may include a p-type semiconductor layer. For example, the first semiconductor layer 11 may include at least one semiconductor material among InAlGaN, GaN, AlGaN, InGaN, and AlN, and may include a p-type semiconductor layer doped with a first conductivity type dopant such as Mg. However, the material configuring the first semiconductor layer 11 is not limited thereto, and various other materials may configure the first semiconductor layer 11.

The active layer 12 may be disposed between the first semiconductor layer 11 and the second semiconductor layer 13. The active layer 12 may include any of a single well structure, a multi well structure, a single quantum well structure, a multi quantum well (MQW) structure, a quantum dot structure, and a quantum wire structure, but is not limited thereto. The active layer 12 may include GaN, InGaN, InAlGaN, AlGaN, or AlN, and various other materials may configure the active layer 12.

In case that a voltage equal to or greater than a threshold voltage is applied to both ends of the light emitting element LD, an electron-hole pair may be combined in the active layer 12 and thus the light emitting element LD emits light. By controlling emission of the light emitting element LD using such a principle, the light emitting element LD may be used as a light source of various light emitting devices including a pixel of a display device.

The second semiconductor layer 13 may be disposed on the active layer 12 and may include a semiconductor layer of a type different from that of the first semiconductor layer 11. The second semiconductor layer 13 may include an n-type semiconductor layer. For example, the second semiconductor layer 13 may include at least one semiconductor material among InAlGaN, GaN, AlGaN, InGaN, and AlN, and may include an n-type semiconductor layer doped with a second conductivity type dopant such as phosphorus Si, Ge, and Sn. However, the material configuring the second semiconductor layer 13 is not limited thereto, and the second semiconductor layer 13 may be configured of various other materials.

The electrode layer 14 may be disposed on the first end EP1 and/or the second end EP2 of the light emitting element LD. FIG. 2 illustrates a case in which the electrode layer 14 may be formed on the first semiconductor layer 11, but the disclosure is not limited thereto. For example, a separate contact electrode may be further disposed on the second semiconductor layer 13.

The electrode layer 14 may include a transparent metal or a transparent metal oxide. For example, the electrode layer 14 may include at least one of indium tin oxide (ITO), indium zinc oxide (IZO), and zinc tin oxide (ZTO), but is not limited thereto. As described above, in case that the electrode layer 14 is formed of the transparent metal or the transparent metal oxide, light generated in the active layer 12 of the light emitting element LD may pass through the electrode layer 14 and may be emitted to the outside of the light emitting element LD.

An insulating layer INF may be provided on a surface of the light emitting element LD. The insulating film INF may be directly disposed on a surface of the first semiconductor layer 11, the active layer 12, the second semiconductor layer 13, and/or the electrode layer 14. The insulating film INF may expose the first and second ends EP1 and EP2 of the light emitting element LD having different polarities. According to an embodiment, the insulating film INF may expose a side portion of the electrode layer 14 and/or the second semiconductor layer 13 adjacent to the first and second ends EP1 and EP2 of the light emitting element LD.

The insulating layer INF may prevent an electrical short that may occur in case that the active layer 12 comes into contact with a conductive material except for the first and second semiconductor layers 11 and 13. The insulating layer INF may minimize a surface defect of the light emitting elements LD, thereby improving lifespan and emission efficiency of the light emitting elements LD.

The insulating film INF may include at least one of silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and titanium oxide (TiOx). For example, the insulating film INF may be configured of a double layer, and each layer configuring the double layer may include different materials. For example, the insulating film INF may be configured of a double layer configured of aluminum oxide (AlOx) and silicon oxide (SiOx), but is not limited thereto. According to an embodiment, the insulating film INF may be omitted.

A light emitting device including the light emitting element LD described above may be used in various types of devices that require a light source, including a display device. For example, multiple light emitting elements LD may be disposed in each pixel of a display panel, and the light emitting elements LD may be used as a light source of each pixel. However, an application field of the light emitting element LD is not limited to the above-described example. For example, the light emitting element LD may also be used in other types of devices that require a light source, such as a lighting device.

Figure 3:
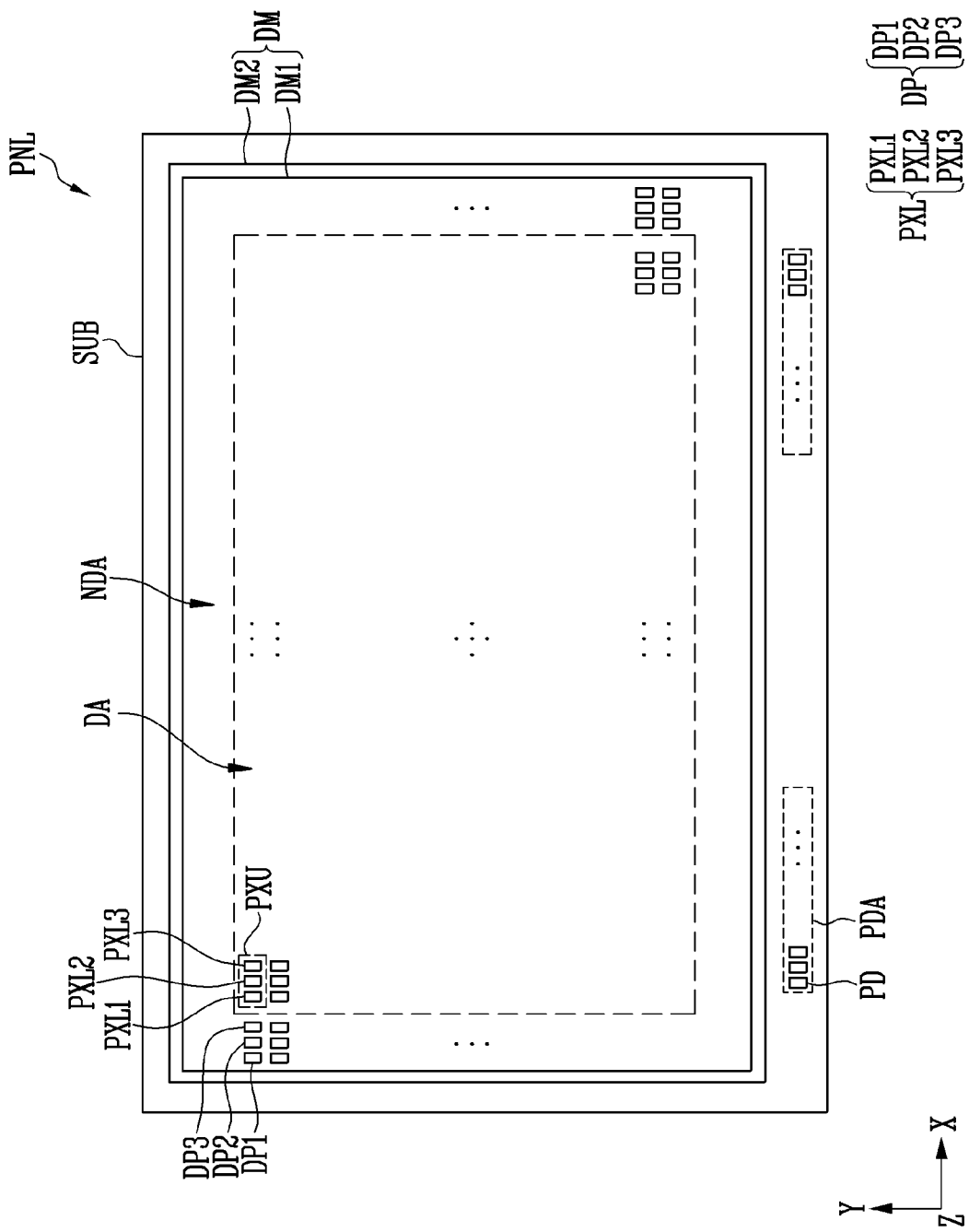
FIG. 3 is a schematic plan view illustrating a display device according to an embodiment.

FIG. 3 is a schematic plan view illustrating a display device according to an embodiment.

In FIG. 3, as an example of an electronic device that may use the light emitting element LD described in the embodiments of FIGS. 1 and 2 as a light source, a display device, particularly, a display panel PNL provided in the display device is shown.

For convenience of description, in FIG. 3, a structure of the display panel PNL is briefly shown based on a display area DA. However, according to an embodiment, at least one driving circuit unit (for example, at least one of a scan driver and a data driver), lines, and/or pads, which are/is not shown, may be further disposed on the display panel PNL.

Referring to FIG. 3, the display panel PNL and a substrate SUB for forming the same may include the display area DA and a non-display area NDA except for the display area DA. The display area DA may configure a screen on which an image may be displayed, and the non-display area NDA may be an area except for the display area DA.

A pixel unit PXU may be disposed in the display area DA. The pixel unit PXU may include a first sub-pixel PXL1, a second sub-pixel PXL2, and/or a third sub-pixel PXL3. Hereinafter, when at least one sub-pixel among the first sub-pixel PXL1, the second sub-pixel PXL2, and the third sub-pixel PXL3 is arbitrarily referred to, or when two or more types of sub-pixels are collectively referred to, the at least one sub-pixel or the two or more types of sub-pixels is referred to as a "sub-pixel PXL" or "sub-pixels PXL".

The sub-pixels PXL may be regularly arranged according to a stripe or PenTile® arrangement structure, or the like. However, the arrangement structure of the sub-pixels PXL is not limited thereto, and the sub-pixels PXL may be arranged in the display area DA in various structures and/or methods.

According to an embodiment, two or more types of sub-pixels PXL emitting light of different colors may be disposed in the display area DA. For example, in the display area DA, first sub-pixels PXL1 emitting light of a first color, second sub-pixels PXL2 emitting light of a second color, and third sub-pixels PXL3 emitting light of a third color may be arranged. At least one of the first to third sub-pixels PXL1, PXL2, and PXL3 arranged to be adjacent to each other may configure one pixel unit PXU capable of emitting light of various colors. For example, each of the first to third sub-pixels PXL1, PXL2, and PXL3 may be a sub-pixel emitting light of a color. According to an embodiment, the first sub-pixel PXL1 may be a red pixel emitting red light, the second sub-pixel PXL2 may be a green pixel emitting green light, and the third sub-pixel PXL3 may be a blue pixel emitting blue light, but are not limited thereto.

In an embodiment, the first sub-pixel PXL1, the second sub-pixel PXL2, and the third sub-pixel PXL3 may include light emitting elements that emit light of a same color, and may include a color conversion layer and/or a color filter layer of different colors disposed on the respective light emitting element, to emit light of the first color, the second color, and the third color, respectively. In another embodiment, the first sub-pixel PXL1, the second sub-pixel PXL2, and the third sub-pixel PXL3 may include a light emitting element of the first color, a light emitting element of the second color, and a light emitting element of the third color as a light source, to emit light of the first color, the second color, and the third color, respectively. However, the color, type, number, and/or the like of sub-pixels PXL configuring each pixel unit PXU are/is not limited. For example, the color of light emitted by each sub-pixel PXL may be variously changed.

The sub-pixel PXL may include at least one light source driven by a control signal (for example, a scan signal and a data signal) and/or power (for example, first power and second power). In an embodiment, the light source may include at least one light emitting element LD according to any of the embodiments of FIGS. 1 and 2, for example, an ultra-small column shape light emitting element LD having a size as small as a nanometer scale to a micrometer scale. However, the disclosure is not limited thereto, and various types of light emitting elements LD may be used as the light source of the sub-pixel PXL.

In an embodiment, each sub-pixel PXL may be configured as an active pixel. However, a type, a structure, and/or a driving method of the sub-pixels PXL applicable to the display device are/is not limited. For example, each sub-pixel PXL may be configured as a pixel of a passive or active light emitting display device of various structures and/or driving methods.

The non-display area NDA may be disposed adjacent to (e.g., around) the display area DA. Dummy pixels DP, a pad area PDA, and/or dams DM1 and DM2 may be disposed in the non-display area NDA.

Dummy pixels DP may be formed to minimize a side effect such as a process deviation or a loading effect that may occur during a manufacturing process of the display device, and may be formed to surround the sub-pixels to serve as a kind of buffer area.

The dummy pixels DP may include a first dummy pixel DP1, a second dummy pixel DP2, and a third dummy pixel DP3. Hereinafter, when at least one dummy pixel among the first dummy pixel DP1, the second dummy pixel DP2, and the third dummy pixel DP3 is arbitrarily referred to, or when two or more types of dummy pixels are collectively referred to, at least one dummy pixel or two or more types of dummy pixels may be referred to as a "dummy pixel DP" or "dummy pixels DP".

The dummy pixels DP may be formed in rows or columns. For example, the first dummy pixel DP1, the second dummy pixel DP2, and the third dummy pixel DP3 may be disposed in a same row. The first dummy pixel DP1 may be an outer dummy pixel adjacent to the dams DM1 and DM2, the third dummy pixel DP3 may be an inner dummy pixel adjacent to the display area DA, and the second dummy pixel DP2 may be disposed between the first dummy pixel DP1 and the third dummy pixel DP3. However, the arrangement structure of the dummy pixels DP is not limited thereto, and the dummy pixels DP may be arranged in the non-display area NDA in various structures and/or methods.

A pad portion PD may be disposed in the pad area PDA. For example, the pad portion PD may be connected to a driving circuit such as a source driver and a timing controller mounted on a circuit board. In case that the display panel PNL is connected to multiple source drivers, the pad areas PDA may respectively correspond to the source drivers. The sub-pixel PXL may be electrically connected to the pad portion PD to receive a data signal from the source driver. In case that a built-in circuit unit (for example, a gate driver), is provided in the display panel PNL, the built-in circuit unit may be connected to the pad portion PD. In FIG. 3, the pad portion PD (or the pad area PDA) may be disposed on only a lower side of the display panel PNL, but the disclosure is not limited thereto. For example, the pad portion PD may be disposed on each of an upper side and a lower of the display panel PNL.

The dams DM1 and DM2 may be disposed in the non-display area NDA and may be provided to surround the display area DA. The dams DM1 and DM2 may prevent an organic layer, photoresist, or the like from flowing out and overflowing onto circuit elements including the pad area PDA. To this end, the dams DM1 and DM2 may be disposed between the dummy pixels DP and the pad area PDA. In FIG. 3, a case in which the dams DM1 and DM2 may be configured of the first dam DM1 and the second dam DM2 is illustrated, but the disclosure is not limited thereto.

Each of the dams DM1 and DM2 may include an organic material such as acrylates resin, epoxy resin, phenolic resin, polyamides resin, polyimides resin, polyester resin, polyphenylenesulfides resin, benzocyclobutene (BCB), or a combination thereof. However, the disclosure is not limited thereto, and each of the dams DM1 and DM2 may include various types of inorganic materials including silicon oxide (SiOx), silicon nitride (SiNx), silicon oxynitride (SiOxNy), aluminum nitride (AlNx), aluminum oxide (AlOx), and zirconium oxide, hafnium oxide (HfOx), titanium oxide (TiOx), or a combination thereof.

Figure 4:
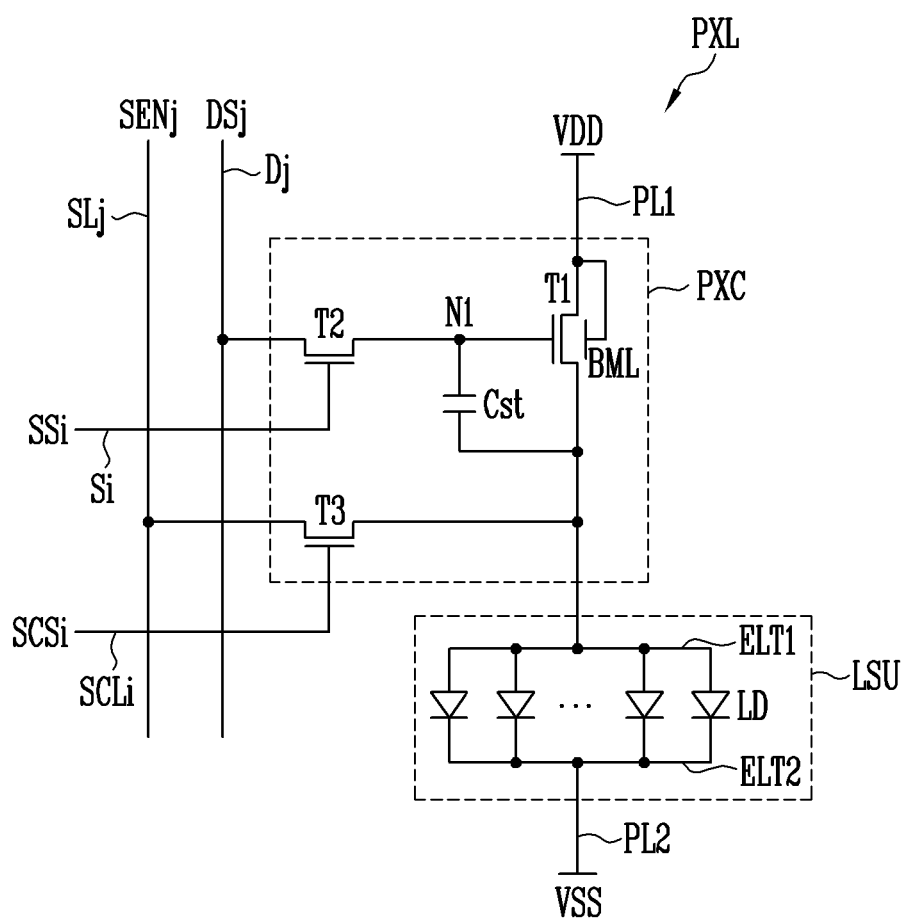
FIG. 4 is a schematic circuit diagram illustrating a sub-pixel according to an embodiment.

FIG. 4 is a schematic circuit diagram illustrating a sub pixel according to an embodiment.

Referring to FIG. 4, the sub-pixel PXL may include a light emitting unit LSU for generating light of a luminance corresponding to a data signal, and a pixel circuit PXC for driving the light emitting unit LSU.

The light emitting unit LSU may include at least one light emitting element LD connected between first power VDD and second power VSS. For example, the light emitting unit LSU may include a first electrode ELT1 connected to the first power VDD through the pixel circuit PXC and a first power line PL1, a second electrode ELT2 connected to the second power VSS through a second power line PL2, and light emitting elements LD electrically connected between the first and second electrodes ELT1 and ELT2. In an embodiment, the first electrode ELT1 may be an anode electrode, and the second electrode ELT2 may be a cathode electrode.

Each of the light emitting elements LD may include the first end EP1 connected to the first power VDD through the first electrode ELT1 and/or the pixel circuit PXC, and the second end EP2 connected to the second power VSS through the second electrode ELT2. For example, the light emitting elements LD may be connected in a forward direction between the first and second electrodes ELT1 and ELT2. Each light emitting element LD connected in the forward direction between the first power VDD and the second power VSS may configure a respective effective light source, and the effective light sources may be collected to configure the light emitting unit LSU of the sub-pixel PXL.

The first power VDD and the second power VSS may have different potentials so that the light emitting elements LD may emit light. For example, the first power VDD may be set as a high potential power, and the second power VSS may be set as a low potential power. A potential difference between the first power VDD and the second power VSS may be set to be greater than or equal to a threshold voltage of the light emitting elements LD during at least emission period of the sub-pixel PXL.

An end of the light emitting elements LD configuring each light emitting unit LSU may be commonly connected to the pixel circuit PXC through an electrode (for example, the first electrode ELT1 of each sub-pixel PXL) of the light emitting unit LSU, and may be connected to the first power VDD through the pixel circuit PXC and the first power line PL1. Another end of the light emitting elements LD may be commonly connected to the second power VSS through another electrode (for example, the second electrode ELT2 of each sub-pixel PXL) of the light emitting unit LSU and the second power line PL2.

The light emitting elements LD may emit light with a luminance corresponding to a driving current supplied through the corresponding pixel circuit PXC. For example, during each frame period, the pixel circuit PXC may supply the driving current corresponding to a grayscale value to be expressed in a corresponding frame to the light emitting unit LSU. The driving current supplied to the light emitting unit LSU may be divided and flow through the light emitting elements LD connected in the forward direction. Accordingly, the light emitting unit LSU may emit light of the luminance corresponding to the driving current while each light emitting element LD emits light with a luminance corresponding to a current flowing therein.

The pixel circuit PXC may be connected between the first power VDD and the first electrode ELT1. The pixel circuit PXC may be connected to a scan line Si and a data line Dj of a corresponding sub-pixel PXL. For example, in case that the sub-pixel PXL is disposed on an i-th (i may be a natural number) horizontal line (row) and a j-th (j may be a natural number) vertical line (column) of the display area DA, the pixel circuit PXC may be connected to the i-th scan line Si and the j-th data line Dj of the display area DA.

According to an embodiment, the pixel circuit PXC may include multiple transistors T1, T2, and T3 and at least one storage capacitor Cst.

The first transistor T1 may be connected between the first power VDD and the light emitting unit LSU. For example, a first electrode (for example, a drain electrode) of the first transistor T1 may be connected to the first power VDD, and a second electrode (for example, a source electrode) of the first transistor T1 may be connected to the first electrode ELT1. A gate electrode of the first transistor T1 may be connected to a first node N1. The first transistor T1 may control the driving current supplied to the light emitting unit LSU in response to a voltage of the first node N1. For example, the first transistor T1 may be a driving transistor that controls the driving current of the sub-pixel PXL.

In an embodiment, the first transistor T1 may further include a lower conductive layer BML (also referred to as a "lower electrode", a "back gate electrode", or a "lower light blocking layer"). The gate electrode of the first transistor T1 and the lower conductive layer BML may overlap each other with an insulating layer interposed therebetween. The lower conductive layer BML may be connected to an electrode of the first transistor T1, for example, the source electrode or the drain electrode.

In case that the first transistor T1 includes the lower conductive layer BML, in case that the sub-pixel PXL is driven, a back-biasing technique (or sync technique) that moves a threshold voltage of the transistor T1 in a negative direction or a positive direction by applying a back-biasing voltage to the lower conductive layer BML of the first transistor T1 may be applied. For example, the threshold voltage of the first transistor T1 may be moved in the negative direction or the positive direction, by applying a source-sink technique by connecting the lower conductive layer BML to the source electrode of the first transistor T1. In case that the lower conductive layer BML is disposed under a semiconductor pattern configuring a channel of the first transistor T1, the lower conductive layer BML may serve as a light blocking pattern and may stabilize an operation characteristic of the first transistor T1. However, the function and/or utilization method of the lower conductive layer BML is not limited thereto.

The second transistor T2 may be connected between the data line Dj and the first node N1. For example, a first electrode of the second transistor T2 may be connected to the data line Dj, and a second electrode of the second transistor T2 may be connected to the first node N1. A gate electrode of the second transistor T2 may be connected to the scan line Si. The second transistor T2 may be turned on in case that a scan signal SSi of a gate-on voltage (for example, a high level voltage) is supplied from the scan line Si, to electrically connect the data line Dj and the first node N1.

In each frame period, a data signal DSj of the corresponding frame may be supplied to the data line Dj, and the data signal DSj may be transferred to the first node N1 through the second transistor T2 turned on during a period in which the scan signal SSi of the gate-on voltage may be supplied. For example, the second transistor T2 may be a switching transistor for transferring each data signal DSj to an inside of the sub-pixel PXL.

The third transistor T3 may be connected between the first transistor T1 and a sensing line SLj. For example, an electrode of the third transistor T3 may be connected to the second electrode (for example, the source electrode) of the first transistor T1 connected to the first electrode ELT1, and another electrode of the third transistor T3 may be connected to the sensing line SLj. In case that the sensing line SLj is omitted, the other electrode of the third transistor T3 may be connected to the data line Dj.

A gate electrode of the third transistor T3 may be connected to a sensing control line SCLi. In case that the sensing control line SCLi is omitted, the gate electrode of the third transistor T3 may be connected to the scan line Si. The third transistor T3 may be turned on by a sensing control signal SCSI of a gate-on voltage (for example, a high level voltage) supplied to the sensing control line SCLi during a sensing period, to electrically connect the sensing line SLj and the first transistor T1.

According to an embodiment, a sensing period may be a period in which a characteristic (for example, a threshold voltage or the like of the first transistor T1) of each of the sub-pixels PXL disposed in the display area DA may be extracted. During the sensing period, the first transistor may be turned on by supplying a reference voltage, at which the first transistor T1 may be turned on, to the first node N1 through the data line Dj and the second transistor T2, or connecting each sub-pixel PXL to a current source or the like. The third transistor T3 may be turned on by supplying the sensing control signal SCSI of the gate-on voltage to the third transistor T3, to connect the first transistor T1 to the sensing line SLj. Thereafter, a sensing signal SENj may be obtained through the sensing line SLj, and the characteristic of each sub-pixel PXL including the threshold voltage or the like of the first transistor T1 may be detected using the sensing signal SENj. Information on the characteristic of each sub-pixel PXL may be used to convert image data so that a characteristic deviation between the sub-pixels PXL disposed in the display area DA may be compensated.

An electrode of the storage capacitor Cst may be connected to the second electrode of the first transistor T1, and another electrode may be connected to the first node N1. The storage capacitor Cst may charge a voltage corresponding to the data signal DSj supplied to the first node N1 during each frame period.

FIG. 4 shows an embodiment in which all of the effective light sources, that is, the light emitting elements LD, configuring each light emitting unit LSU, may be connected in parallel, but the disclosure is not limited thereto. For example, the light emitting unit LSU of each sub-pixel PXL may include at least two stages of series structures. The light emitting elements configuring each series stage may be connected in series with each other by at least one intermediate electrode.

In FIG. 4, all transistors included in the pixel circuit PXC may be n-type transistors, but the disclosure is not limited thereto. For example, at least one of the first to third transistors T1, T2, and T3 may be changed to a p-type transistor.

A structure and a driving method of the sub-pixel PXL may be variously changed. For example, the pixel circuit PXC may be configured of a pixel circuit of various structures and/or driving methods in addition to an embodiment shown in FIG. 4.

Figure 5:
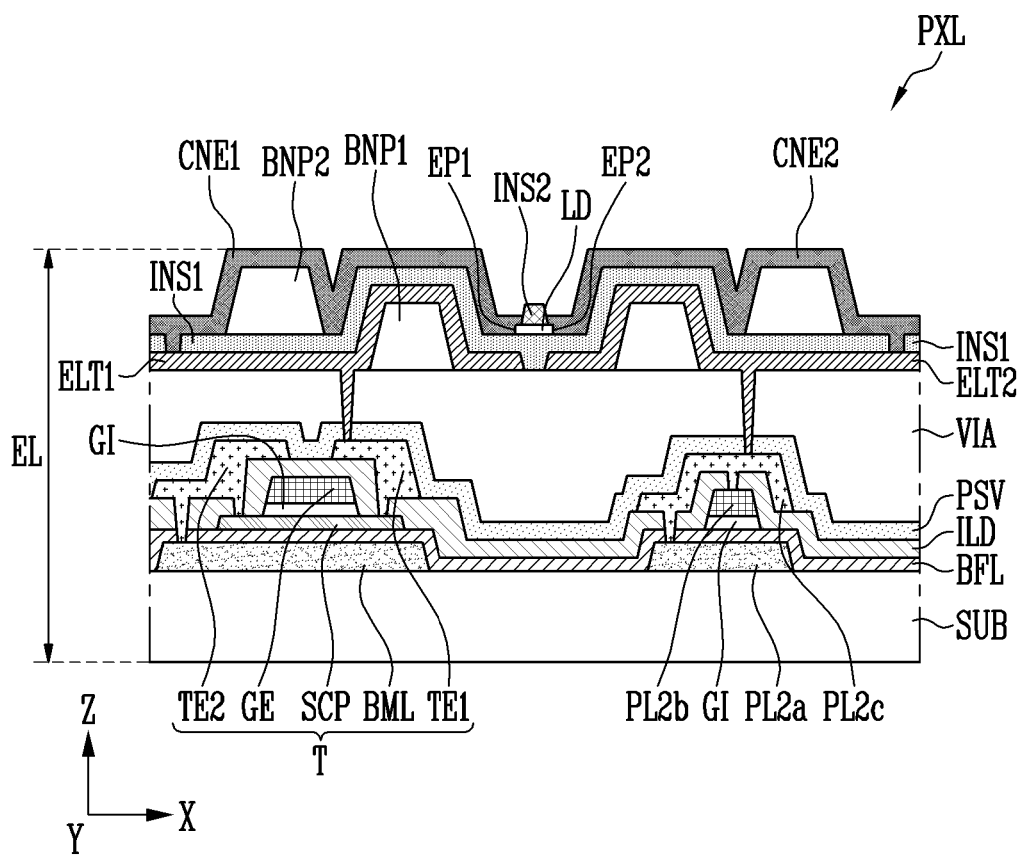
FIGS. 5 and 6 are schematic cross-sectional views illustrating a sub-pixel according to an embodiment.
Figure 6:
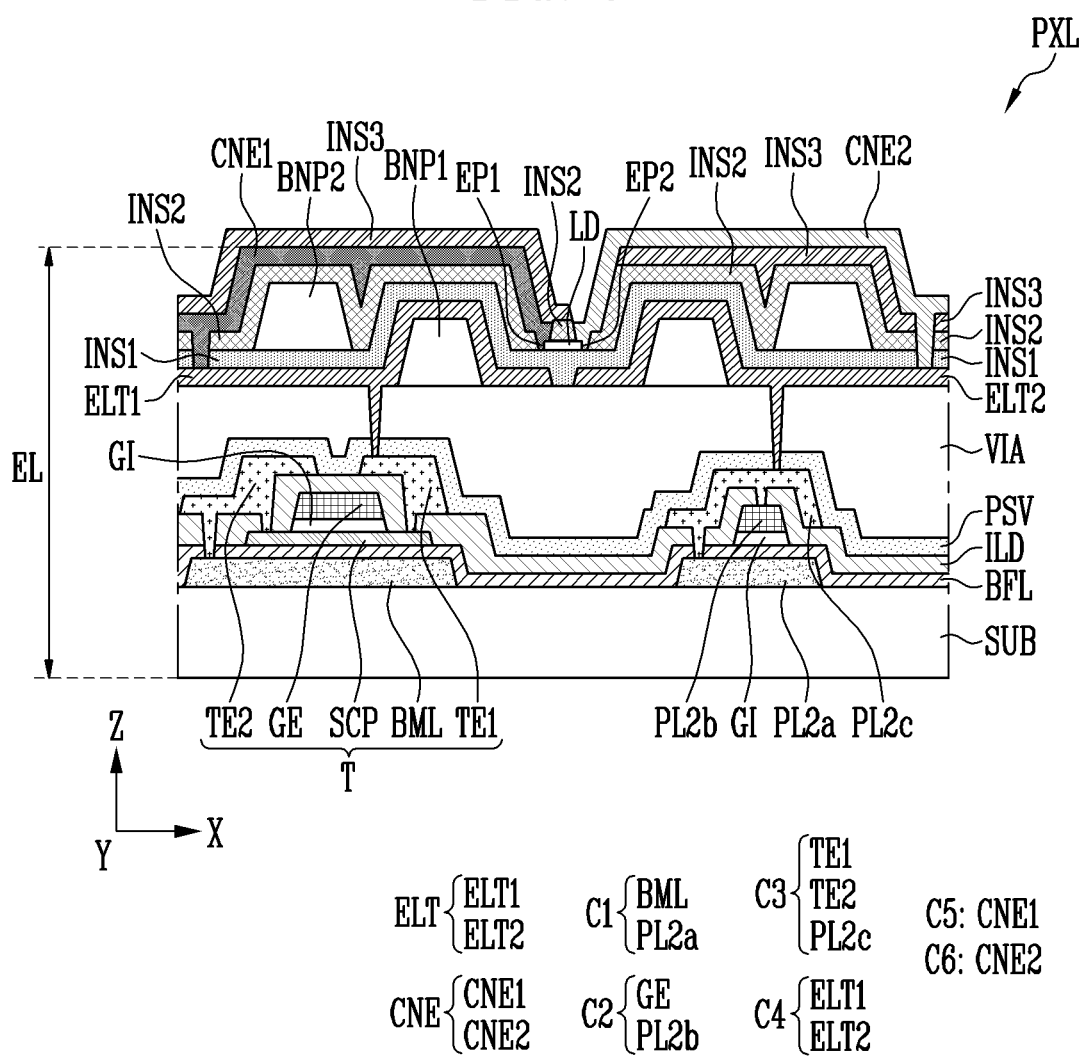

FIGS. 5 and 6 are schematic cross-sectional views illustrating a sub-pixel according to an embodiment.

FIGS. 5 and 6 illustrate a light emitting element layer EL of the sub-pixel PXL. In FIGS. 5 and 6, the first transistor T1 among various circuit elements configuring the pixel circuit PXC of FIG. 4 is shown. When the first to third transistor T1, T2, and T3 are not required to be separately specified, the first to third transistors T1, T2, and T3 are collectively referred to as a "transistor T". A structure, a position of each layer, and/or the like of the transistors T are/is not limited to an embodiment shown in FIGS. 5 and 6, and may be variously changed according to an embodiment.

Referring to FIGS. 5 and 6, the light emitting element layer EL of the sub-pixels PXL according to an embodiment may include circuit elements including transistors T disposed on the substrate SUB, and various lines connected to the circuit elements. On the circuit elements, first and second electrodes ELT1 and ELT2 (also referred to as "alignment electrodes") configuring the light emitting unit LSU, the light emitting elements LD, and/or first and second connection electrodes CNE1 and CNE2 may be disposed. Hereinafter, when the first and second electrodes ELT1 and ELT2 are collectively referred to or at least one electrode is arbitrarily referred to, the first and second electrodes ELT1 and ELT2 or the at least one electrode is referred to "electrodes ELT" or an "electrode ELT", and when the first and second connection electrodes CNE1 and CNE2 are collectively referred to or at least one connection electrode is arbitrarily referred to, the first and second connection electrodes CNE1 and CNE2 or the at least one connection electrode is referred to "connection electrodes CNE" or a "connection electrode CNE".

The substrate SUB may configure a base member, and may be a rigid or flexible substrate or film. For example, the substrate SUB may be a rigid substrate formed of glass or tempered glass, a flexible substrate (or a thin film) formed of a plastic or metal material, or an insulating layer of at least one layer. A material and/or a physical property of the substrate SUB are/is not limited. In an embodiment, the substrate SUB may be substantially transparent. Here, "substantially transparent" may mean that light may be transmitted at a transmittance or more. In another embodiment, the substrate SUB may be translucent or opaque. The substrate SUB may include a reflective material according to an embodiment.

A first conductive layer C1 may be disposed on the substrate SUB. The first conductive layer C1 may include the lower conductive layer BML of the transistor T and a first power conductive layer PL2a. The lower conductive layer BML and the first power conductive layer PL2a may be disposed on a same layer. For example, the lower conductive layer BML and the first power conductive layer PL2a may be simultaneously formed in a same process, but are not limited thereto. The first power conductive layer PL2a may configure the second power line PL2 described with reference to FIG. 4 and the like.

The first conductive layer C1 may be configured as a single layer or multiple layers formed of at least one of molybdenum (Mo), copper (Cu), aluminum (Al), chromium (Cr), gold (Au), titanium (Ti), nickel (Ni), neodymium (Nd), and indium tin oxide (ITO), or an alloy thereof.

A buffer layer BFL may be disposed on the first conductive layer C1. The buffer layer BFL may prevent an impurity from being diffused into the circuit element. The buffer layer BFL may be configured of a single layer, but may be configured of multiple layers of at least two or more layers. In case that the buffer layer BFL is formed of multiple layers, each layer may be formed of a same material or may be formed of different materials.

The semiconductor pattern SCP may be disposed on the buffer layer BFL. For example, each semiconductor pattern SCP may include a first region that may be in contact with the first transistor electrode TE1, a second region that may be in contact with the second transistor electrode TE2, and a channel region positioned between the first and second regions. According to an embodiment, one of the first and second regions may be a source region and the other may be a drain region.

According to an embodiment, the semiconductor pattern SCP may be formed of polysilicon, amorphous silicon, oxide semiconductor, or the like, or a combination thereof. The channel region of the semiconductor pattern SCP may be an intrinsic semiconductor as a semiconductor pattern in which an impurity may not be doped. Each of the first and second regions of the semiconductor pattern SCP may be a semiconductor in which an impurity may be doped.

A gate insulating layer GI may be disposed on the buffer layer BFL and the semiconductor pattern SCP. For example, the gate insulating layer GI may be disposed between the semiconductor pattern SCP and the gate electrode GE. The gate insulating layer GI may be disposed between the buffer layer BFL and the second power conductive layer PL2b. The gate insulating layer GI may be configured as a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), titanium oxide (TiOx), or a combination thereof.

A second conductive layer C2 may be disposed on the gate insulating layer GI. The second conductive layer C2 may include the gate electrode GE of the transistor T and a second power conductive layer PL2b. The gate electrode GE and the second power conductive layer PL2b may be disposed on a same layer. For example, the gate electrode GE and the second power conductive layer PL2b may be simultaneously formed in a same process, but are not limited thereto. The gate electrode GE may be disposed to overlap the semiconductor pattern SCP in a third direction (Z-axis direction) on the gate insulating layer GI. The second power conductive layer PL2b may be disposed to overlap the first power conductive layer PL2a in the third direction (Z-axis direction) on the gate insulating layer GI. The second power conductive layer PL2b may configure the second power line PL2 described with reference to FIG. 4 and the like together with the first power conductive layer PL2a.

The second conductive layer C2 may be configured as a single layer or multiple layers formed of at least one of titanium (Ti), copper (Cu), indium tin oxide (ITO), molybdenum (Mo), chromium (Cr), gold (Au), nickel (Ni), and neodymium (Nd), or an alloy thereof. For example, the second conductive layer C2 may be formed as multiple layers in which titanium (Ti), copper (Cu), and/or indium tin oxide (ITO) may be sequentially or repeatedly stacked on each other. A detailed description thereof is described later with reference to FIGS. 8 and 9.

An interlayer insulating layer ILD may be disposed on the second conductive layer C2. For example, the interlayer insulating layer ILD may be disposed between the gate electrode GE and the first and second transistor electrodes TE1 and TE2. The interlayer insulating layer ILD may be disposed between the second power conductive layer PL2b and a third power conductive layer PL2c.

The interlayer insulating layer ILD may be configured as a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), titanium oxide (TiOx), or a combination thereof.

A third conductive layer C3 may be disposed on the interlayer insulating layer ILD. The third conductive layer C3 may include the first and second transistor electrodes TE1 and TE2 of the transistor T and the third power conductive layer PL2c. The first and second transistor electrodes TE1 and TE2 and the third power conductive layer PL2c may be disposed on a same layer. For example, the first and second transistor electrodes TE1 and TE2 and the third power conductive layer PL2c may be simultaneously formed in a same process, but are not limited thereto.

The first and second transistor electrodes TE1 and TE2 may be disposed on the interlayer insulating layer ILD. The first and second transistor electrodes TE1 and TE2 may be disposed to overlap the semiconductor pattern SCP in the third direction (Z-axis direction). The first and second transistor electrodes TE1 and TE2 may be electrically connected to the semiconductor pattern SCP. For example, the first transistor electrode TE1 may be electrically connected to the first region of the semiconductor pattern SCP through a contact hole passing through the interlayer insulating layer ILD. The second transistor electrode TE2 may be electrically connected to the second region of the semiconductor pattern SCP through a contact hole passing through the interlayer insulating layer ILD. The second transistor electrode TE2 may be electrically connected to the lower conductive layer BML through a contact hole passing through the interlayer insulating layer ILD and the buffer layer BFL. According to an embodiment, one of the first and second transistor electrodes TE1 and TE2 may be a source electrode, and the other may be a drain electrode.

The third power conductive layer PL2c may be disposed to overlap the first power conductive layer PL2a and/or the second power conductive layer PL2b in the third direction (Z-axis direction). The third power conductive layer PL2c may be electrically connected to the first power conductive layer PL2a and/or the second power conductive layer PL2b. For example, the third power conductive layer PL2c may be electrically connected to the first power conductive layer PL2a through a contact hole passing through the interlayer insulating layer ILD and the buffer layer BFL. The third power conductive layer PL2c may be electrically connected to the second power conductive layer PL2b through a contact hole passing through the interlayer insulating layer ILD. The third power conductive layer PL2c may configure the second power supply line PL2 together with the first power conductive layer PL2a and/or the second power conductive layer PL2b described with reference to FIG. 4 and the like.

The third conductive layer C3 may be configured as a single layer or multiple layers formed of at least one of aluminum (Al), molybdenum (Mo), chromium (Cr), gold (Au), titanium (Ti), nickel (Ni), neodymium (Nd), and indium tin oxide (ITO), or an alloy thereof.

A protective layer PSV may be disposed on the third conductive layer C3. The protective layer PSV may be configured as a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), titanium oxide (TiOx), or a combination thereof.

A via layer VIA may be disposed on the protective layer PSV. The via layer VIA may be formed of an organic material to flatten a lower step difference. For example, the via layer VIA may include an organic material such as an acrylates resin, an epoxy resin, a phenolic resin, a polyamides resin, a polyimides resin, a polyesters resin, a polyphenylenesulfides resin, benzocyclobutene (BCB), or a combination thereof. However, the disclosure is not limited thereto, and the via layer VIA may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), titanium oxide (TiOx), or a combination thereof.

First bank patterns BNP1 may be disposed on the via layer VIA. The first bank patterns BNP1 may have various shapes according to an embodiment. In an embodiment, the first bank patterns BNP1 may have a shape protruding in the third direction (Z-axis direction) on the substrate SUB. The first bank patterns BNP1 may be formed to have an inclined surface inclined at an angle with respect to the substrate SUB. However, the disclosure is not limited thereto, and the first bank patterns BNP1 may have a sidewall of a curved surface, a step shape, or the like. For example, the first bank patterns BNP1 may have a cross section of a semicircle shape, a semi-ellipse shape, or the like.

Electrodes and insulating layers disposed on the first bank patterns BNP1 may have a shape corresponding to the first bank patterns BNP1. For example, the first and second electrodes ELT1 and ELT2 disposed on the first bank patterns BNP1 may include an inclined surface or a curved surface having a shape corresponding to the shape of the first bank patterns BNP1. Accordingly, the first bank patterns BNP1 may function as a reflective member that improves emission efficiency of the display panel PNL by guiding the light emitted from the light emitting elements LD in the front direction, that is, the third direction (Z-axis direction) of the sub pixel PXL together with the first and second electrodes ELT1 and ELT2 provided on the first bank patterns BNP1.

The first bank patterns BNP1 may include at least one organic material and/or inorganic material. For example, the first bank patterns BNP1 may include an organic material such as an acrylates resin, an epoxy resin, a phenolic resin, a polyamides resin, a polyimides resin, a polyesters resin, a polyphenylenesulfides resin, benzocyclobutene (BCB), or a combination thereof. However, the disclosure is not limited thereto, and the first bank patterns BNP1 may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), titanium oxide (TiOx), or a combination thereof.

A fourth conductive layer C4 may be disposed on the via layer VIA and the first bank patterns BNP1. The fourth conductive layer C4 may include the first and second electrodes ELT1 and ELT2. The first and second electrodes ELT1 and ELT2 may be disposed to be spaced apart from each other in the sub-pixel PXL. The first and second electrodes ELT1 and ELT2 may be disposed on a same layer. For example, the first and second electrodes ELT1 and ELT2 may be simultaneously formed in a same process, but are not limited thereto.

The first electrode ELT1 may be electrically connected to the first transistor electrode TE1 of the transistor T through a contact hole passing through the via layer VIA and the protective layer PSV. The second electrode ELT2 may be electrically connected to the third power conductive layer PL2c through a contact hole passing through the via layer VIA and the protective layer PSV.

The first and second electrodes ELT1 and ELT2 may receive an alignment signal in an alignment step of the light emitting elements LD. Accordingly, an electric field may be formed between the first and second electrodes ELT1 and ELT2, and thus the light emitting elements LD supplied to each of the sub-pixels PXL may be aligned between the first and second electrodes ELT1 and ELT2.

The fourth conductive layer C4 may include at least one conductive material. For example, the fourth conductive layer C4 may include at least one metal among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu) or an alloy including the at least one metal, a conductive oxide such as indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), and gallium tin oxide (GTO), and at least one conductive material among conductive polymers such as PEDOT, but is not limited thereto.

A first insulating layer INS1 may be disposed on the fourth conductive layer C4. The first insulating layer INS1 may be configured as a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), titanium oxide (TiOx), or a combination thereof.

A second bank pattern BNP2 may be disposed on the first insulating layer INS1. The second bank pattern BNP2 may form a dam structure that partitions an emission area to which the light emitting elements LD are to be supplied in a step of supplying the light emitting elements LD to each of the sub-pixels PXL. For example, a desired type and/or an amount of light emitting element ink may be supplied to the area partitioned by the second bank pattern BNP2.

The second bank pattern BNP2 may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited thereto, and the second bank pattern BNP2 may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), titanium oxide (TiOx), or a combination thereof.

According to an embodiment, the second bank pattern BNP2 may include at least one light blocking and/or reflective material. Accordingly, light leakage between the adjacent sub-pixels PXL may be prevented. For example, the second bank pattern BNP2 may include at least one black matrix material, a color filter material, and/or the like. For example, the second bank pattern BNP2 may be formed as a black opaque pattern capable of blocking transmission of light. In an embodiment, a reflective layer or the like, which is not shown, may be formed on a surface (for example, a sidewall) of the second bank pattern BNP2 to increase light efficiency of each sub-pixel PXL.

The light emitting elements LD may be disposed on the first insulating layer INS1. The light emitting elements LD may be disposed between the first and second electrodes ELT1 and ELT2 on the first insulating layer INS1. The light emitting elements LD may be prepared in a dispersed form in the light emitting element ink, and may be supplied to each sub-pixel PXL through an inkjet printing method or the like. For example, the light emitting elements LD may be dispersed in a volatile solvent and provided to each of the sub-pixels PXL. Subsequently, in case that an alignment signal is supplied to the first and second electrodes ELT1 and ELT2, an electric field may be formed between the first and second electrodes ELT1 and ELT2, and thus the light emitting elements LD may be aligned between the first and second electrodes ELT1 and ELT2. After the light emitting elements LD may be aligned, the solvent may be evaporated or removed by other methods to stably arrange the light emitting elements LD between the first and second electrodes ELT1 and ELT2.

A second insulating layer INS2 may be disposed on the first insulating layer INS1 and the light emitting elements LD. For example, the second insulating layer INS2 may be partially provided on the first insulating layer INS1 and the light emitting elements LD, and may expose the first and second ends EP1 and EP2 of the light emitting elements LD. In case that the second insulating layer INS2 is formed on the light emitting elements LD after the alignment of the light emitting elements LD is completed, the light emitting elements LD may be prevented from being separated from an aligned position. The first and second connection electrodes CNE1 and CNE2 to be described later may be stably separated by forming the second insulating layer INS2 on the light emitting elements LD.

The second insulating layer INS2 may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and titanium oxide (TiOx), or a combination thereof.

The first and second connection electrodes CNE1 and CNE2 may be respectively disposed on the first and second ends EP1 and EP2 of the light emitting elements LD exposed by the second insulating layer INS2. The first connection electrode CNE1 may be directly disposed on the first end EP1 of the light emitting elements LD and may be in contact with the first end EP1 of the light emitting elements LD. The second connection electrode CNE2 may be directly disposed on the second end EP2 of the light emitting elements LD and may be in contact with the second end EP2 of the light emitting elements LD. The first connection electrode CNE1 may be electrically connected to the first electrode ELT1 through a contact hole passing through the second insulating layer INS2 and the first insulating layer INS1. The second connection electrode CNE2 may be electrically connected to the second electrode ELT2 through a contact hole passing through the second insulating layer INS2 and the first insulating layer INS1.

Referring to FIG. 5, the first and second connection electrodes CNE1 and CNE2 may be disposed on a same layer. For example, the first and second connection electrodes CNE1 and CNE2 may be configured of a fifth conductive layer C5. The first and second connection electrodes CNE1 and CNE2 may be simultaneously formed in a same process, but are not limited thereto.

Referring to FIG. 6, the first and second connection electrodes CNE1 and CNE2 may be disposed on different layers. For example, the first connection electrode CNE1 may be configured of a fifth conductive layer C5, and the second connection electrode CNE2 may be configured of a sixth conductive layer C6. A third insulating layer INS3 may be further disposed between the fifth conductive layer C5 and the sixth conductive layer C6. The third insulating layer INS3 may cover the first connection electrode CNE1 formed of the fifth conductive layer C5 and expose the second end EP2 of the light emitting elements LD. The second connection electrode CNE2 formed of the sixth conductive layer C6 may be disposed on the second end EP2 of the light emitting element LD exposed by the third insulating layer INS3. As described above, in case that the third insulating layer INS3 is disposed between the first and second connection electrodes CNE1 and CNE2 formed of different conductive layers, since the first and second connection electrodes CNE1 and CNE2 may be stably separated by the third insulating layer INS3, electrical stability between the first and second ends EP1 and EP2 of the light emitting elements LD may be secured.

The fifth conductive layer C5 and/or the sixth conductive layer C6 may be formed of various transparent conductive materials. For example, the fifth conductive layer C5 and/or the sixth conductive layer C6 may include at least one of various transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), and gallium tin oxide (GTO), and may be implemented to be substantially transparent or translucent to satisfy a light transmittance. Accordingly, the light emitted from the first and second ends EP1 and EP2 of the light emitting elements LD may pass through the first and second connection electrodes CNE1 and CNE2 and may be emitted outside of the display panel PNL.

The third insulating layer INS3 may be configured as a single layer or multiple layers, and may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), titanium oxide (TiOx), or a combination thereof.

Figure 7:
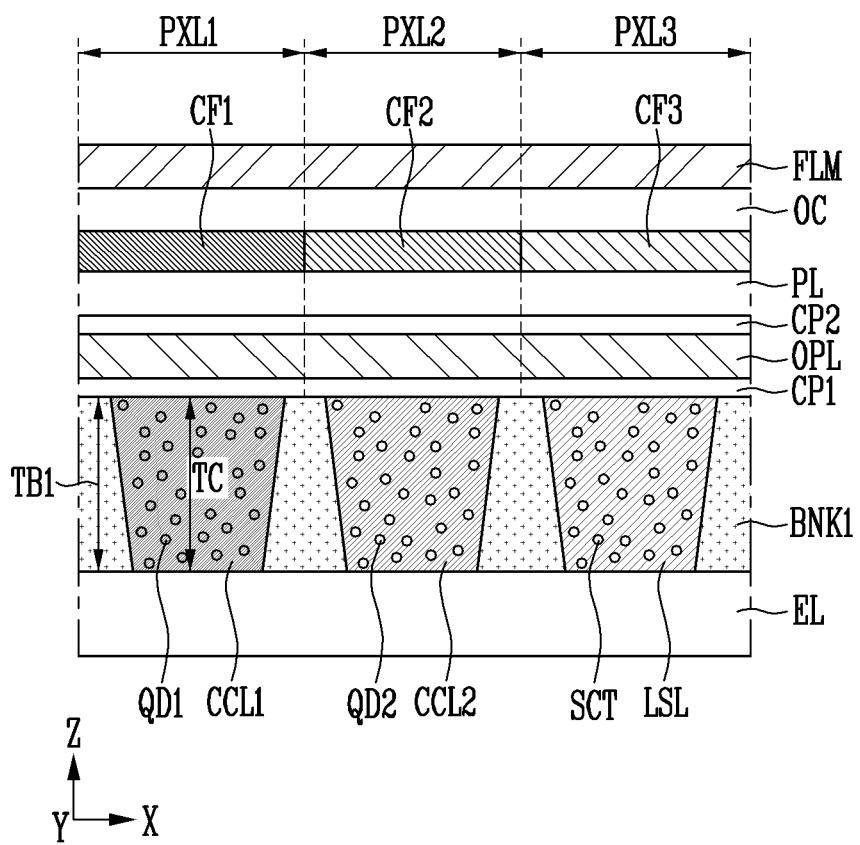
FIG. 7 is a schematic cross-sectional view illustrating first to third sub-pixels according to an embodiment.

FIG. 7 is a schematic cross-sectional view illustrating first to third sub-pixels according to an embodiment. FIG. 7 shows a first bank BNK1, a color conversion layer CCL, and/or a color filter layer CFL provided on the light emitting element layer EL of the sub-pixel PXL described with reference to FIGS. 5 and 6, and the like.

Referring to FIG. 7, the first bank BNK1 may be disposed on the light emitting element layer EL of the first to third sub-pixels PXL1, PXL2, and PXL3. For example, the first bank BNK1 may be disposed among the first to third sub-pixels PXL1, PXL2, and PXL3, and may include an opening overlapping each of the first to third sub-pixels PXL1, PXL2, and PXL3. The opening of the first bank BNK1 may provide a space in which the color conversion layer CCL may be provided.

The first bank BNK1 may include an organic material such as an acrylates resin, an epoxy resin, a phenolic resin, a polyamides resin, a polyimides resin, a polyesters resin, a polyphenylenesulfides resin, benzocyclobutene (BCB), or a combination thereof. However, the disclosure is not limited thereto, and the first bank BNK1 may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), titanium oxide (TiOx), or a combination thereof. In an embodiment, the first bank BNK1 may include a same material as the dams DM1 and DM2 described with reference to FIG. 3. The first bank BNK1 may be disposed on a same layer as the dams DM1 and DM2. For example, the first bank BNK1 may be simultaneously formed in a same process as the dams DM1 and DM2, but is not limited thereto.

According to an embodiment, the first bank BNK1 may include at least one light blocking and/or reflective material. Accordingly, light leakage between the adjacent sub-pixels PXL may be prevented. For example, the first bank BNK1 may include at least one black matrix material, color filter material, and/or the like. For example, the first bank BNK1 may be formed of a black opaque pattern capable of blocking transmission of light. In an embodiment, a reflective film or the like, which is not shown, may be formed on a surface (for example, a sidewall) of the first bank BNK1 to increase light efficiency of each sub-pixel PXL.

In an embodiment, a thickness TB1 of the third direction (Z-axis direction) of the first bank BNK1 may be about 10 μm or more, but is not limited thereto.

The color conversion layer CCL may be disposed on the light emitting element layer EL including the light emitting elements LD in the opening of the first bank BNK1. In an embodiment, a thickness TC of the third direction (Z-axis direction) of the color conversion layer CCL may be substantially the same as the thickness TB1 of the third direction (Z-axis direction) of the first bank BNK1. However, the disclosure is not limited thereto, and the thickness TC of the third direction (Z-axis direction) of the color conversion layer CCL may be formed to be less than the thickness TB1 of the third direction (Z-axis direction) of the first bank BNK1.

The color conversion layer CCL may include a first color conversion layer CCL1 disposed in the first sub-pixel PXL1, a second color conversion layer CCL2 disposed in the second sub-pixel PXL2, and a scattering layer LSL disposed in the third sub-pixel PXL3.

In an embodiment, the first to third sub-pixels PXL1, PXL2, and PXL3 may include light emitting elements LD that emit light of a same color. For example, the first to third sub-pixels PXL1, PXL2, and PXL3 may include light emitting elements LD emitting light of a third color (or blue). The color conversion layer CCL including color conversion particles may be disposed on each of the first to third sub-pixels PXL1, PXL2, and PXL3 to display a full-color image.

The first color conversion layer CCL1 may include first color conversion particles that convert light of the third color emitted from the light emitting element LD into light of the first color. For example, the first color conversion layer CCL1 may include first quantum dots QD1 dispersed in a matrix material such as a base resin.

In an embodiment, in case that the light emitting element LD is a blue light emitting element emitting blue light and the first sub-pixel PXL1 is a red pixel, the first color conversion layer CCL1 may include the first quantum dot QD1 that converts the blue light emitted from the blue light emitting element into red light. The first quantum dot QD1 may absorb the blue light and shift a wavelength according to an energy transition to emit the red light. In case that the first sub-pixel PXL1 is a pixel of a different color, the first color conversion layer CCL1 may include a first quantum dot QD1 corresponding to the color of the first sub-pixel PXL1.

The second color conversion layer CCL2 may include second color conversion particles that convert light of the third color emitted from the light emitting element LD into light of the second color. For example, the second color conversion layer CCL2 may include second quantum dots QD2 dispersed in a matrix material such as a base resin.

In an embodiment, in case that the light emitting element LD is the blue light emitting element emitting the blue light and the second sub-pixel PXL2 is a green pixel, the second color conversion layer CCL2 may include a second quantum dot QD2 that converts the blue light emitted from the blue light emitting element into green light. The second quantum dot QD2 may absorb the blue light and shift a wavelength according to an energy transition to emit the green light. In case that the second sub-pixel PXL2 is a pixel of a different color, the second color conversion layer CCL2 may include a second quantum dot QD2 corresponding to the color of the second sub-pixel PXL2.

In an embodiment, an absorption coefficient of the first quantum dot QD1 and the second quantum dot QD2 may be increased by allowing the blue light having a relatively short wavelength in a visible light region to be incident on each of the first quantum dot QD1 and the second quantum dot QD2. Accordingly, efficiency of light emitted from the first sub-pixel PXL1 and the second sub-pixel PXL2 may be improved, and excellent color reproducibility may be secured. Manufacturing efficiency of the display device may be increased, by configuring the light emitting unit LSU of the first to third sub-pixels PXL1, PXL2, and PXL3 using the light emitting elements LD of a same color (for example, the blue light emitting element).

The scattering layer LSL may be provided to efficiently use the light of the third color (or blue) emitted from the light emitting element LD. For example, in case that the light emitting element LD is the blue light emitting element emitting the blue light and the third sub-pixel PXL3 is the blue pixel, the scattering layer LSL may include at least one type of scatterer SCT in order to efficiently use the light emitted from the light emitting element LD.

For example, the scattering layer LSL may include scatterers SCT dispersed in a matrix material such as a base resin. For example, the scattering layer LSL may include a scatterer SCT such as silica, but a configuration material of the scatterer SCT is not limited thereto. The scatterer SCT may not be disposed only in the third sub-pixel PXL3, and may also be selectively included in the first color conversion layer CCL1 or the second color conversion layer CCL2. According to an embodiment, the scatterer SCT may be omitted to provide the scattering layer LSL formed of a transparent polymer.

A first capping layer CP1 may be disposed on the color conversion layer CCL. The first capping layer CP1 may be provided over the first to third sub-pixels PXL1, PXL2, and PXL3. The first capping layer CP1 may cover the color conversion layer CCL. The first capping layer CP1 may prevent an impurity such as moisture or air from penetrating from the outside and damaging or contaminating the color conversion layer CCL.

The first capping layer CP1 may be an inorganic layer, and may include silicon nitride (SiNx), aluminum nitride (AlNx), titanium nitride (TiNx), silicon oxide (SiOx), aluminum oxide (AlOx), titanium oxide (TiOx), silicon oxycarbide (SiOxCy), silicon oxynitride (SiOxNy), or the like, or a combination thereof.

An optical layer OPL may be disposed on the first capping layer CP1. The optical layer OPL may be provided over the first to third sub-pixels PXL1, PXL2, and PXL3.

The optical layer OPL may serve to improve light extraction efficiency by recycling light provided from the color conversion layer CCL by total reflection. To this end, the optical layer OPL may have a relatively low refractive index compared to the color conversion layer CCL. For example, the refractive index of the color conversion layer CCL may be about 1.6 to about 2.0, and the refractive index of the optical layer OPL may be about 1.1 to about 1.3, but are not limited thereto.

In an embodiment, a thickness of the third direction (Z-axis direction) of the optical layer OPL capable of improving the light extraction efficiency may be about 0.1 to about 5 µm. In other embodiments, the thickness of the third direction (Z-axis direction) of the optical layer OPL may be about 0.5 to about 2.5 µm. However, the disclosure is not limited thereto, and the thickness of the optical layer OPL may be variously changed within a range capable of improving the light extraction efficiency.

According to an embodiment, the optical layer OPL may include a base resin and a hollow particle dispersed in the base resin. The hollow particle may include a hollow silica particle. In other embodiments, the hollow particle may be a pore formed by porogen, but is not limited thereto. The optical layer OPL may include at least one of a zinc oxide (ZnO) particle, a titanium dioxide (TiO2) particle, and a nano silicate particle, but is not limited thereto.

A second capping layer CP2 may be disposed on the optical layer OPL. The second capping layer CP2 may be provided over the first to third sub-pixels PXL1, PXL2, and PXL3. The second capping layer CP2 may cover the optical layer OPL. The second capping layer CP2 may prevent an impurity such as moisture or air from penetrating from the outside and damaging or contaminating the optical layer OPL.

The second capping layer CP2 may be an inorganic layer, and may include silicon nitride (SiNx), aluminum nitride (AlNx), titanium nitride (TiNx), silicon oxide (SiOx), aluminum oxide (AlOx), titanium oxide (TiOx), silicon oxycarbide (SiOxCy), silicon oxynitride (SiOxNy), or the like, or a combination thereof.

A planarization layer PL may be disposed on the second capping layer CP2. The planarization layer PL may be provided over the first to third sub-pixels PXL1, PXL2, and PXL3.

The planarization layer PL may include an organic material such as acrylates resin, epoxy resin, phenolic resin, polyamides resin, polyimides resin, polyester resin, polyphenylenesulfides resin, benzocyclobutene (BCB), or a combination thereof. However, the disclosure is not limited thereto, and the planarization layer PL may include various types of inorganic materials including silicon oxide (SiOx), silicon nitride (SiNx), silicon oxynitride (SiOxNy), aluminum nitride (AlNx), aluminum oxide (AlOx), zirconium oxide, hafnium oxide (HfOx), titanium oxide (TiOx), or a combination thereof.

The color filter layer CFL may be disposed on the planarization layer PL. The color filter layer CFL may include color filters CF1, CF2, and CF3 matching the colors of each sub-pixel PXL. As the color filters CF1, CF2, and CF3 matching the colors of each of the first to third sub-pixels PXL1, PXL2, and PXL3 may be disposed, a full-color image may be displayed.

The color filter layer CFL may include the first color filter CF1 disposed in the first sub-pixel PXL1 to selectively transmit light emitted from the first sub-pixel PXL1, the second color filter CF2 disposed in the second sub-pixel PXL2 to selectively transmit light emitted from the second sub-pixel PXL2, and the third color filter CF3 disposed in the third sub-pixel PXL3 to selectively transmit light emitted from the third sub-pixel PXL3.

In an embodiment, the first color filter CF1, the second color filter CF2, and the third color filter CF3 may be a red color filter, a green color filter, and a blue color filter, respectively, but are not limited thereto. Hereinafter, when any color filter among the first color filter CF1, the second color filter CF2, and the third color filter CF3 is referred to, or two or more types of color filters are collectively referred to, the any color filter or the two or more types of color filters is referred to as a "color filter" or "color filters".

The first color filter CF1 may overlap the light emitting element layer EL (or the light emitting element LD) and the first color conversion layer CCL1 of the first sub-pixel PXL1 in the third direction (Z-axis direction). The first color filter CF1 may include a color filter material that selectively transmits the light of the first color (or red). For example, in case that the first sub-pixel PXL1 is the red pixel, the first color filter CF1 may include a red color filter material.

The second color filter CF2 may overlap the light emitting element layer EL (or the light emitting element LD) and the second color conversion layer CCL2 of the second sub-pixel PXL2 in the third direction (Z-axis direction). The second color filter CF2 may include a color filter material that selectively transmits the light of the second color (or green). For example, in case that the second sub-pixel PXL2 is the green pixel, the second color filter CF2 may include a green color filter material.

The third color filter CF3 may overlap the light emitting element layer EL (or the light emitting element LD) and the scattering layer LSL of the third sub-pixel PXL3 in the third direction (Z-axis direction). The third color filter CF3 may include a color filter material that selectively transmits the light of the third color (or blue). For example, in case that the third sub-pixel PXL3 is the blue pixel, the third color filter CF3 may include a blue color filter material.

An overcoat layer OC may be disposed on the color filter layer CFL. The overcoat layer OC may be provided over the first to third sub-pixels PXL1, PXL2, and PXL3. The overcoat layer OC may cover a lower member including the color filter layer CFL. The overcoat layer OC may prevent moisture or air from penetrating into the above-described lower member. The overcoat layer OC may protect the above-described lower member from a foreign substance such as dust.

The overcoat layer OC may include an organic material such as an acrylates resin, an epoxy resin, a phenolic resin, a polyamides resin, a polyimides resin, a polyesters resin, a polyphenylenesulfides resin, benzocyclobutene (BCB), or a combination thereof. However, the disclosure is not limited thereto, and the overcoat layer OC may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), titanium oxide (TiOx), or a combination thereof.

A light-transmitting film FLM may be disposed on the overcoat layer OC. The light-transmitting film FLM may be provided over the first to third sub-pixels PXL1, PXL2, and PXL3. The light-transmitting film FLM may be attached on a front surface of the display panel PNL to protect the front surface of the display panel PNL or to minimize reflection of external light incident on the display panel PNL. For example, the light-transmitting film FLM may be at least one of a polyethyleneterephthalate (PET) film, a low reflection film, a polarizing film, and a transmittance controllable film, but is not limited thereto.

In general, in a process of attaching the light-transmitting film FLM, a defect such as an air bubble, a foreign substance, lifting, and misalignment may occur. A process (rework) of separating the light-transmitting film FLM from an upper portion of the display panel PNL may be performed. During the rework process, in case that a step difference exists in the lower member of the display panel PNL, cracks may occur in the optical layer OPL or the like, and a problem may occur in that an outer portion (or the non-display area NDA) of the display panel PNL may be peeled off due to cracks of the optical layer OPL. Accordingly, in the display device according to an embodiment, in order to minimize a step difference between the lower member of the non-display area NDA, particularly, a second bank BNK2 of the dummy pixels DP, an organic layer OL may be formed in an opening of the second bank BNK2. Accordingly, cracks may be prevented from occurring in the optical layer OPL or the like during the rework process of the light-transmitting film FLM, thereby minimizing a peeling phenomenon. A detailed description thereof is described later with reference to FIG. 9 and the like.

Hereinafter, the dummy pixel of the display device is described. In the following embodiment, the same configurations as those already described are referred to by the same reference numerals, and a repeated description is omitted or simplified.

Figure 8:
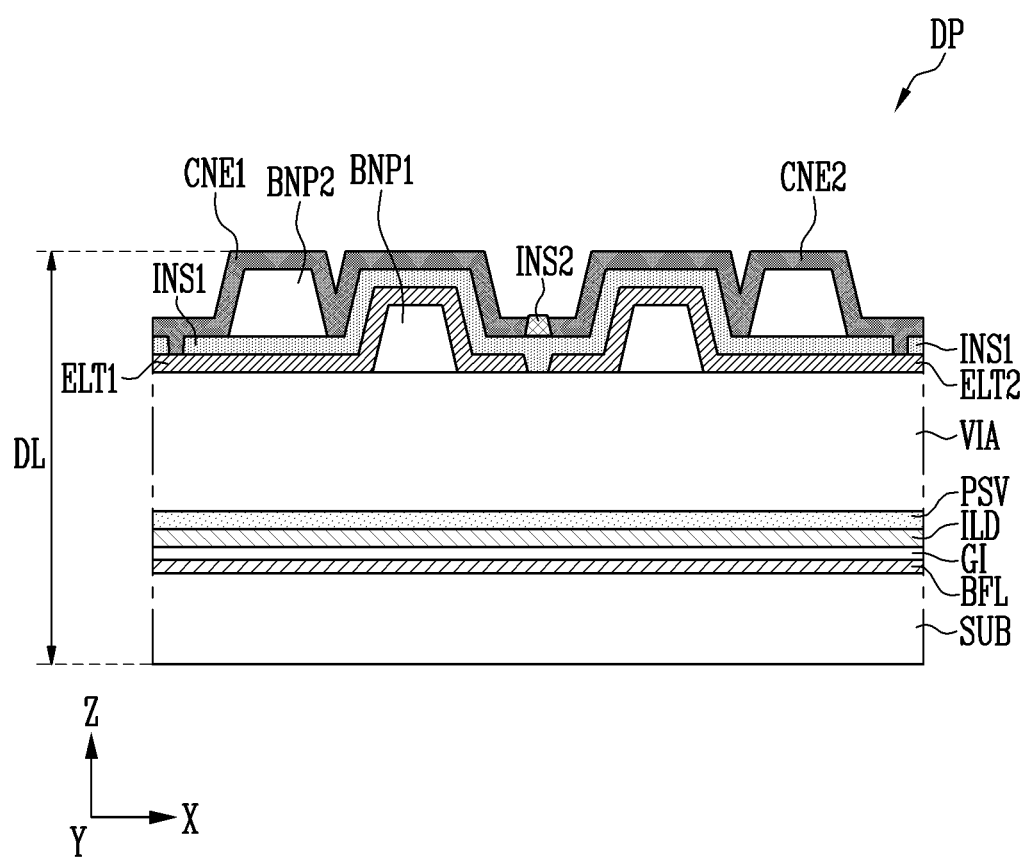
FIG. 8 is a schematic cross-sectional view illustrating a dummy pixel according to an embodiment.

FIG. 8 is a schematic cross-sectional view illustrating a dummy pixel according to an embodiment. FIG. 8 shows a dummy element layer DL of the dummy pixel DP.

Referring to FIG. 8, the dummy element layer DL of the dummy pixels DP according to an embodiment may be distinguished from the light emitting element layer EL of the sub-pixels PXL in that various circuit elements including the transistor T and/or the light emitting elements LD may be omitted. However, the disclosure is not limited thereto, and also in a case of the dummy pixel DP, various circuit elements including the transistor T may be partially provided as in the sub-pixel PXL, and the dummy pixels DP may be formed by electrically separating the circuit elements so that a signal may not be applied to the circuit elements.

In FIG. 8, a case where the dummy element layer DL includes the buffer layer BFL, the gate insulating layer GI, the interlayer insulating layer ILD, the protective layer PSV, the via layer VIA, the first bank patterns BNP1, the first and second electrodes ELT1 and ELT2, the first insulating layer INS1, the second bank patterns BNP2, the second insulating layer INS2, and/or the first and second connection electrodes CNE1 and CNE2 described above is illustrated, but the disclosure is not limited thereto. For example, according to an embodiment, the first bank patterns BNP1, the second bank patterns BNP2, and/or the first and second connection electrodes CNE1 and CNE2 may be omitted from the dummy element layer DL.

Figure 9:
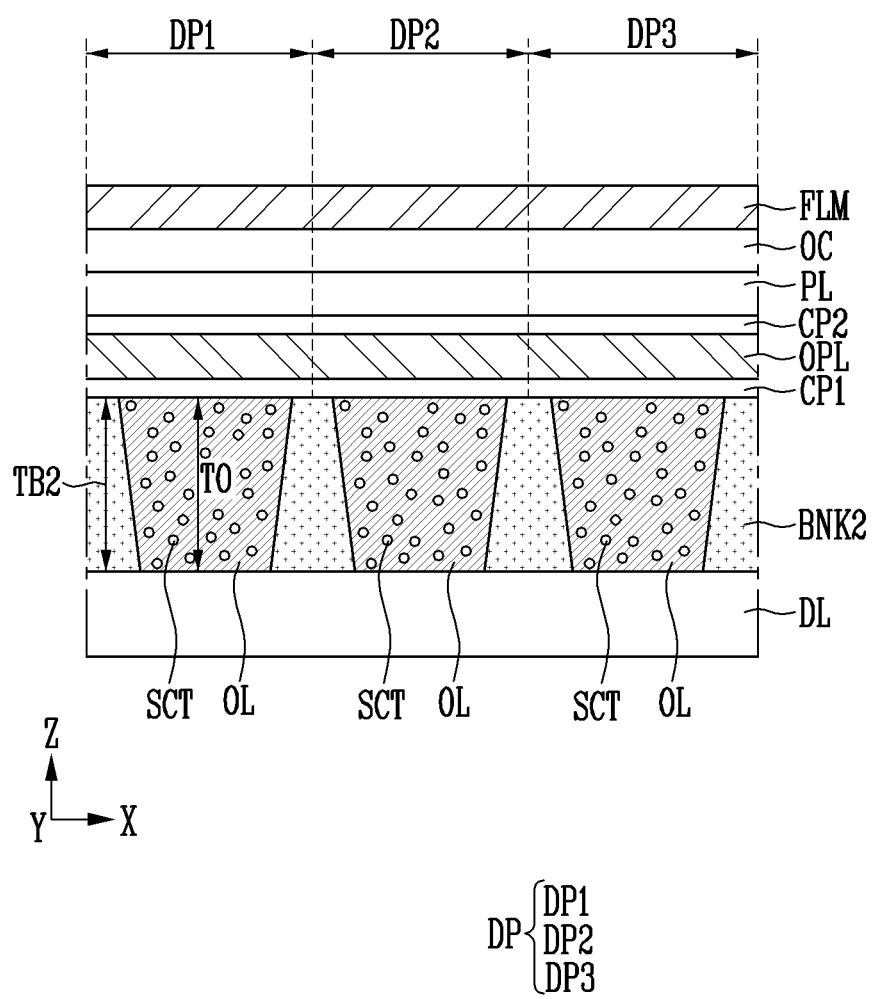
FIG. 9 is a schematic cross-sectional view illustrating first to third dummy pixels according to an embodiment.

FIG. 9 is a schematic cross-sectional view illustrating first to third dummy pixels according to an embodiment. FIG. 9 shows the second bank BNK2 and/or the organic layer OL provided on the dummy element layer DL of the dummy pixel DP described with reference to FIG. 8 and the like.

Referring to FIG. 9, the second bank BNK2 may be disposed on the dummy element layer DL of the first to third dummy pixels DP1, DP2, and DP3. For example, the second bank BNK2 may be partially disposed at a boundary between the first to third dummy pixels DP1, DP2, and DP3. For example, the second bank BNK2 may include an opening overlapping each of the first to third dummy pixels DP1, DP2, and DP3. The opening of the second bank BNK2 may provide a space in which the organic layer OL may be provided.

The second bank BNK2 may include an organic material such as an acrylates resin, an epoxy resin, a phenolic resin, a polyamides resin, a polyimides resin, a polyesters resin, a polyphenylenesulfides resin, benzocyclobutene (BCB), or a combination thereof. However, the disclosure is not limited thereto, and the second bank BNK2 may include various types of inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx). In an embodiment, the second bank BNK2 may include a same material as the first bank BNK1 described with reference to FIG. 7. The second bank BNK2 may be disposed on a same layer as the first bank BNK1. For example, the second bank BNK2 may be simultaneously formed in a same process as the first bank BNK1, but is not limited thereto.

In an embodiment, a thickness TB2 of the third direction (Z-axis direction) of the second bank BNK2 may be about 10 μm or more, but is not limited thereto.

The organic layer OL may be disposed on the dummy element layer DL in the opening of the second bank BNK2. The organic layer OL may be provided to minimize a step difference of the second bank BNK2. For example, as described above, during the rework process of the light-transmitting film FLM, in case that a step difference exists in the lower member of the display panel PNL, cracks may occur in the optical layer OPL or the like, and a problem may occur in that an outer portion (or the non-display area NDA) of the display panel PNL may be peeled off due to cracks of the optical layer OPL. Accordingly, in the display device according to an embodiment, in order to minimize a step difference due to the lower member of the non-display area NDA, particularly, the second bank BNK2 of the dummy pixels DP, the organic layer OL may be formed in the opening of the second bank BNK2.

In an embodiment, a thickness TO of the third direction (Z-axis direction) of the organic layer OL may be substantially the same as the thickness TB2 of the third direction (Z-axis direction) of the second bank BNK2. As described above, in case that the organic layer OL is formed at a thickness in the opening of the second bank BNK2, the step difference due to the non-display area NDA, particularly, the second bank BNK2 of the dummy pixels DP may be minimized. Therefore, cracks may be prevented from occurring in the optical layer OPL or the like during the rework process of the light-transmitting film FLM, thereby minimizing the peeling phenomenon.

The organic layer OL may include a same material as the above-described scattering layer LSL. For example, the organic layer OL may be simultaneously formed in a same process as the scattering layer LSL. As described above, in case that the organic layer OL and the scattering layer LSL are simultaneously formed, an additional process for providing the organic layer OL to the dummy pixels DP may be unnecessary, and thus the manufacturing process of the display device may be simplified. For example, the organic layer OL may include scatterers SCT dispersed in a matrix material such as a base resin. For example, the organic layer OL may include the scatterer SCT such as silica, but the configuration material of the scatterer SCT is not limited thereto. According to an embodiment, the scatterer SCT may be omitted to provide the organic layer OL formed of a transparent polymer.

The first capping layer CP1 may be disposed on the organic layer OL. The first capping layer CP1 may be provided over the first to third dummy pixels DP1, DP2, and DP3. The first capping layer CP1 may cover the organic layer OL. Since the first capping layer CP1 is described in detail with reference to FIG. 7, a repetitive description is omitted.

The optical layer OPL may be disposed on the first capping layer CP1. The optical layer OPL may be provided over the first to third dummy pixels DP1, DP2, and DP3. As described above, as the organic layer OL may be provided in the opening of the second bank BNK2, the step difference due to the lower member of the non-display area NDA, particularly, the second bank BNK2 of the dummy pixels DP may be minimized. Accordingly, cracks may be prevented from occurring in the optical layer OPL during the rework process of the light-transmitting film FLM, thereby minimizing the peeling phenomenon. Since the optical layer OPL is described in detail with reference to FIG. 7, a repetitive description is omitted.

The second capping layer CP2 may be disposed on the optical layer OPL. The second capping layer CP2 may be provided over the first to third dummy pixels DP1, DP2, and DP3. The second capping layer CP2 may cover the optical layer OPL. Since the second capping layer CP2 is described in detail with reference to FIG. 7, a repetitive description is omitted.

The planarization layer PL may be disposed on the second capping layer CP2. The planarization layer PL may be provided over the first to third dummy pixels DP1, DP2, and DP3. Since the planarization layer PL is described in detail with reference to FIG. 7, a repetitive description is omitted.

The overcoat layer OC may be disposed on the planarization layer PL. The overcoat layer OC may be provided over the first to third dummy pixels DP1, DP2, and DP3. The overcoat layer OC may cover the lower member including the planarization layer PL. Since the overcoat layer OC is described in detail with reference to FIG. 7, a repetitive description is omitted.

The light-transmitting film FLM may be disposed on the overcoat layer OC. The light-transmitting film FLM may be provided over the first to third dummy pixels DP1, DP2, and DP3. The light-transmitting film FLM may be attached on the front surface of the display panel PNL to protect the front surface of the display panel PNL or to minimize reflection of external light incident on the display panel PNL. Since the light-transmitting film FLM is described in detail with reference to FIG. 7, a repetitive description is omitted.

According to the above-described embodiments, since the organic layer OL may be provided in the opening of the second bank BNK2 of the dummy pixels DP, the step difference due to the second bank BNK2 may be minimized. Accordingly, cracks may be prevented from occurring in the optical layer OPL during the rework process of the light-transmitting film FLM, thereby minimizing the peeling phenomenon.

Hereinafter, another embodiment is described. In the following embodiment, the same configurations as those already described are referred to by the same reference numerals, and a repeated description is omitted or simplified.

Figure 10:
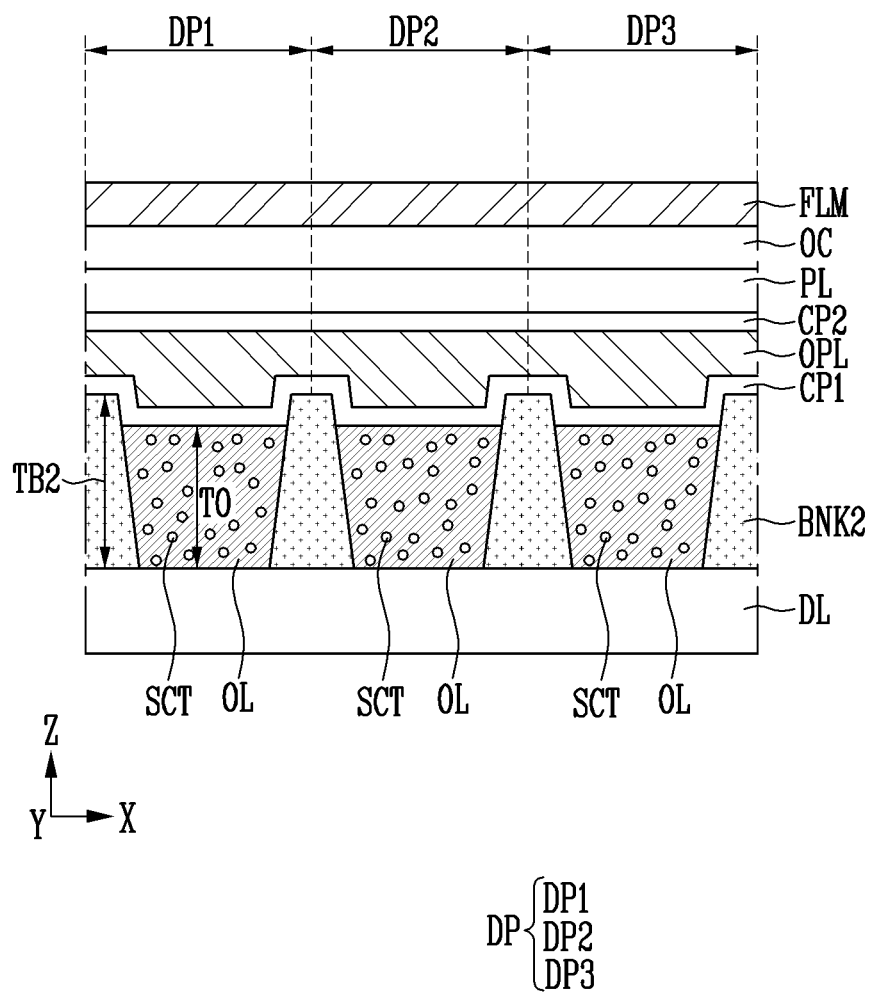
FIG. 10 is a schematic cross-sectional view illustrating first to third dummy pixels according to another embodiment.

FIG. 10 is a schematic cross-sectional view illustrating first to third dummy pixels according to another embodiment.

Referring to FIG. 10, an embodiment may be distinguished from an embodiment of FIGS. 1 to 9 in that the thickness TO of the third direction (Z-axis direction) of the organic layer OL may be less than the thickness TB2 of the third direction (Z-axis direction) of the second bank BNK2.

For example, a difference between the thickness TB2 of the third direction (Z-axis direction) of the second bank BNK2 and the thickness TO of the third direction (Z-axis direction) of the organic layer OL may be about 5 μm or less. For example, in case that the step difference of the second bank BNK2 is formed to be about 5 μm or less, cracks may be prevented from occurring in the optical layer OPL during the rework process of the light-transmitting film FLM, thereby minimizing the peeling phenomenon. In other embodiments, the difference between the thickness TB2 of the third direction (Z-axis direction) of the second bank BNK2 and the thickness TO of the third direction (Z-axis direction) of the organic layer OL may be about 3 μm or less. For example, in case that the step difference of the second bank BNK2 is formed to be about 3 μm or less, cracks may be more effectively prevented from occurring in the optical layer OPL during the rework process of the light-transmitting film FLM, thereby minimizing the peeling phenomenon. However, the step difference of the second bank BNK2 is not limited thereto, and may be variously changed within a range capable of preventing cracks of the optical layer OPL and the peeling phenomenon.

The first capping layer CP1 may be disposed on the organic layer OL. The first capping layer CP1 may cover an inner wall of the opening of the second bank BNK2 exposed by the organic layer OL. Since the first capping layer CP1 is described in detail with reference to FIG. 9, a repetitive description is omitted.

The optical layer OPL may be disposed on the first capping layer CP1. The optical layer OPL may be disposed in the opening of the second bank BNK2 to planarize the step difference between the organic layer OL and the second bank BNK2. Since the optical layer OPL is described in detail with reference to FIG. 9, a repetitive description is omitted.

Figure 11:
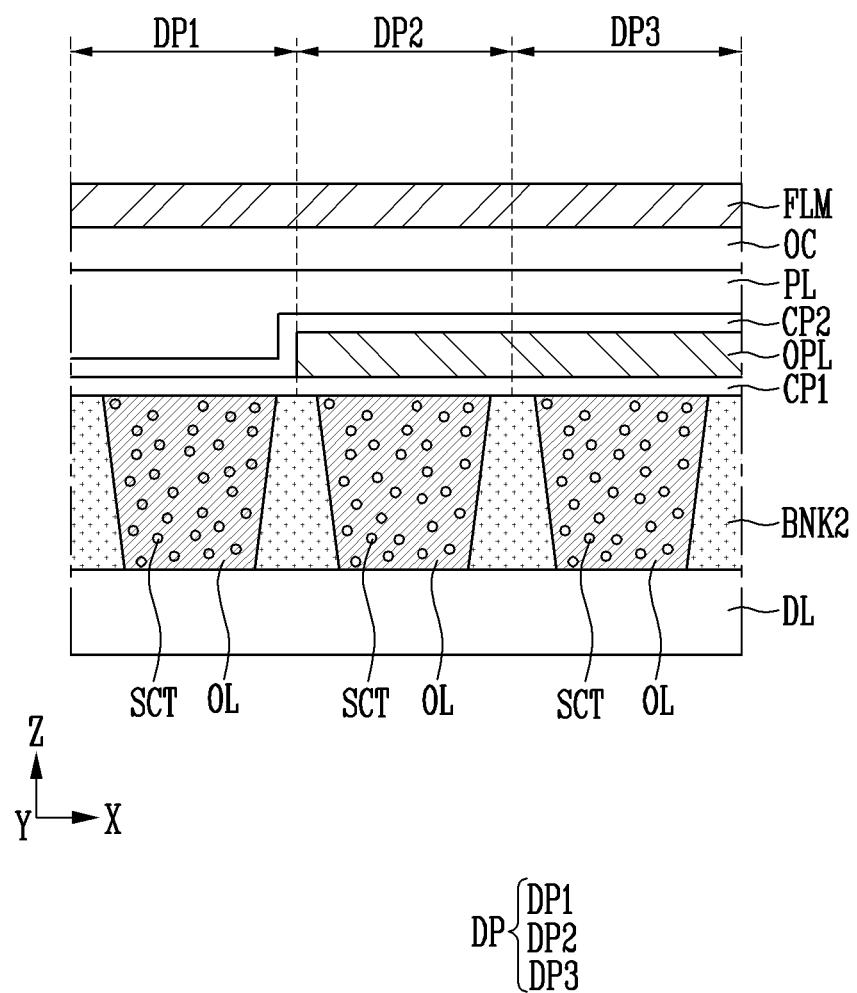
FIG. 11 is a schematic cross-sectional view illustrating first to third dummy pixels according to still another embodiment.

FIG. 11 is a schematic cross-sectional view illustrating first to third dummy pixels according to still another embodiment. Referring to FIG. 11, an embodiment may be distinguished from an embodiment of FIGS. 1 to 9 in that the optical layer OPL may be partially disposed on the first to third dummy pixels DP1, DP2, and DP3.

For example, the optical layer OPL may be disposed on the second dummy pixel DP2 and/or the third dummy pixel DP3 and may not overlap the first dummy pixel DP1 which may be an outer dummy pixel. For example, the optical layer OPL may cover the second dummy pixel DP2 and/or the third dummy pixel DP3 and may expose the first dummy pixel DP1. As described above, in case that the optical layer OPL is omitted from the first dummy pixel DP1 which may be the outer dummy pixel, the optical layer OPL may be prevented from crossing the second bank BNK2 of the first dummy pixel DP1 and being applied to an outside of the dummy pixel DP. Accordingly, cracks may be prevented from occurring in the optical layer OPL due to the step difference between the second bank BNK2 and the outside, thereby minimizing the peeling phenomenon.

In FIG. 11, a case where the optical layer OPL may be partially disposed in the second dummy pixel DP2 and/or the third dummy pixel DP3 is illustrated, but the disclosure is not limited thereto. According to an embodiment, the optical layer OPL may be disposed on the third dummy pixel DP3 and may not overlap not only the first dummy pixel DP1, which may be an outer dummy pixel, but also the second dummy pixel DP2. In FIG. 11, a case where the optical layer OPL entirely overlaps the second dummy pixel DP2 and/or the third dummy pixel DP3 is illustrated, but the disclosure is not limited thereto. For example, the optical layer OPL may partially overlap at least a portion of the second dummy pixel DP2 and/or the third dummy pixel DP3.

The second capping layer CP2 may be disposed on the optical layer OPL, and the planarization layer PL may be disposed on the second capping layer CP2. The planarization layer PL may be additionally disposed in a space where the optical layer OPL may be omitted in the first dummy pixel DP1 to planarize a step difference due to the optical layer OPL.

A method of manufacturing the display device according to the above-described embodiments is now described.

FIGS. 12 to 19 are schematic cross-sectional views for each process step illustrating a method of manufacturing a display device according to an embodiment. FIGS. 12 to 19 are cross-sectional views illustrating the method of manufacturing the display device of FIGS. 7 and 9, and substantially the same components as those of FIGS. 7 and 9 are denoted by the same reference numerals and detailed reference numerals are omitted.

Figure 12:
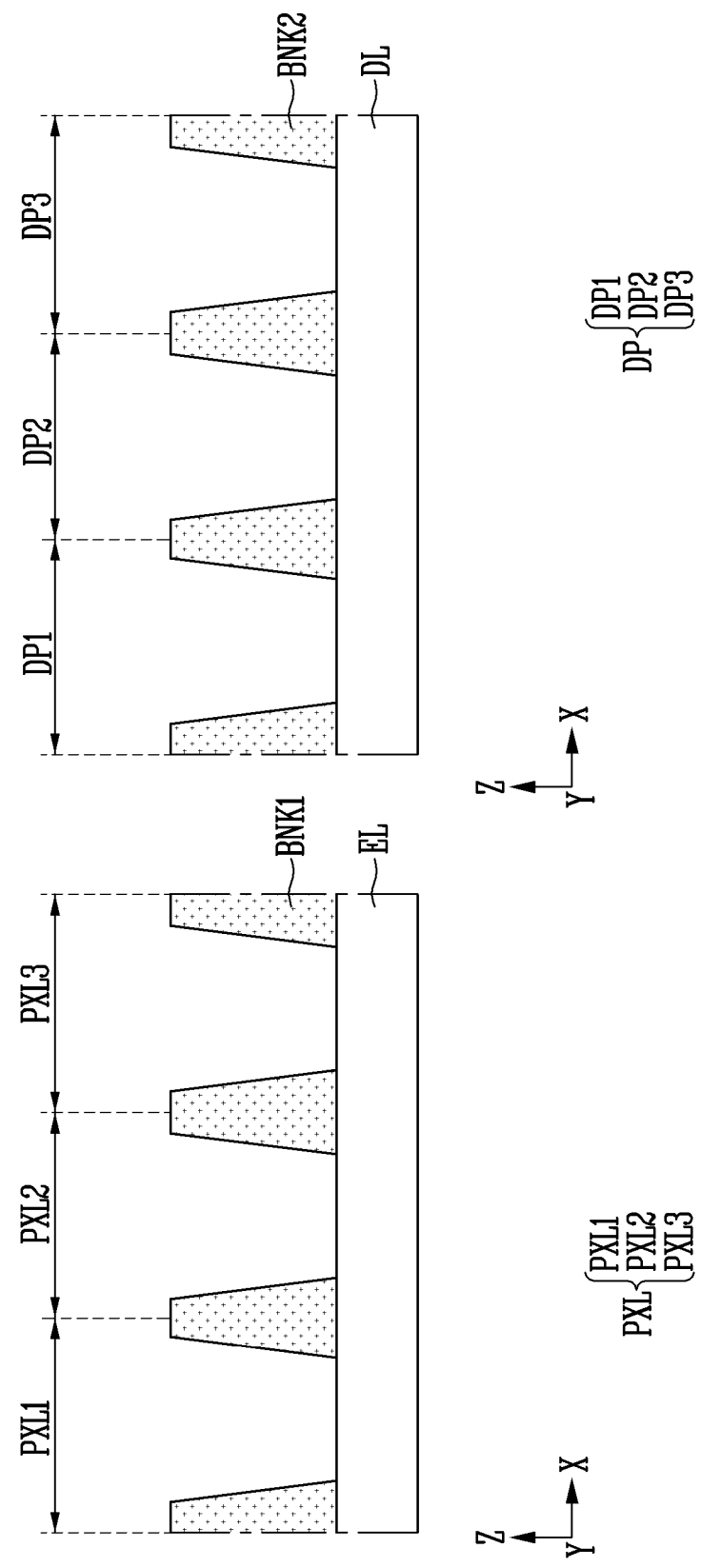
FIGS. 12 to 19 are schematic cross-sectional views for each process step illustrating a method of manufacturing a display device according to an embodiment.

Referring to FIG. 12, first, the first bank BNK1 and the second bank BNK2 are formed. The first bank BNK1 may be formed on the light emitting element layer EL of the sub-pixel PXL. The second bank BNK2 may be formed on the dummy element layer DL of the dummy pixel DP. The first bank BNK1 and the second bank BNK2 may be simultaneously formed in a same process, but are not limited thereto.

The first bank BNK1 may be formed among the first to third sub-pixels PXL1, PXL2, and PXL3, and may include an opening overlapping each of the first to third sub-pixels PXL1, PXL2, and PXL3. The second bank BNK2 may be formed between the first to third dummy pixels DP1, DP2, and DP3, and may include an opening overlapping each of the first to third dummy pixels DP1, DP2, and DP3.

Since the first bank BNK1 and the second bank BNK2 are described in detail with reference to FIGS. 7 and 9, a repetitive description is omitted.

Figure 13:
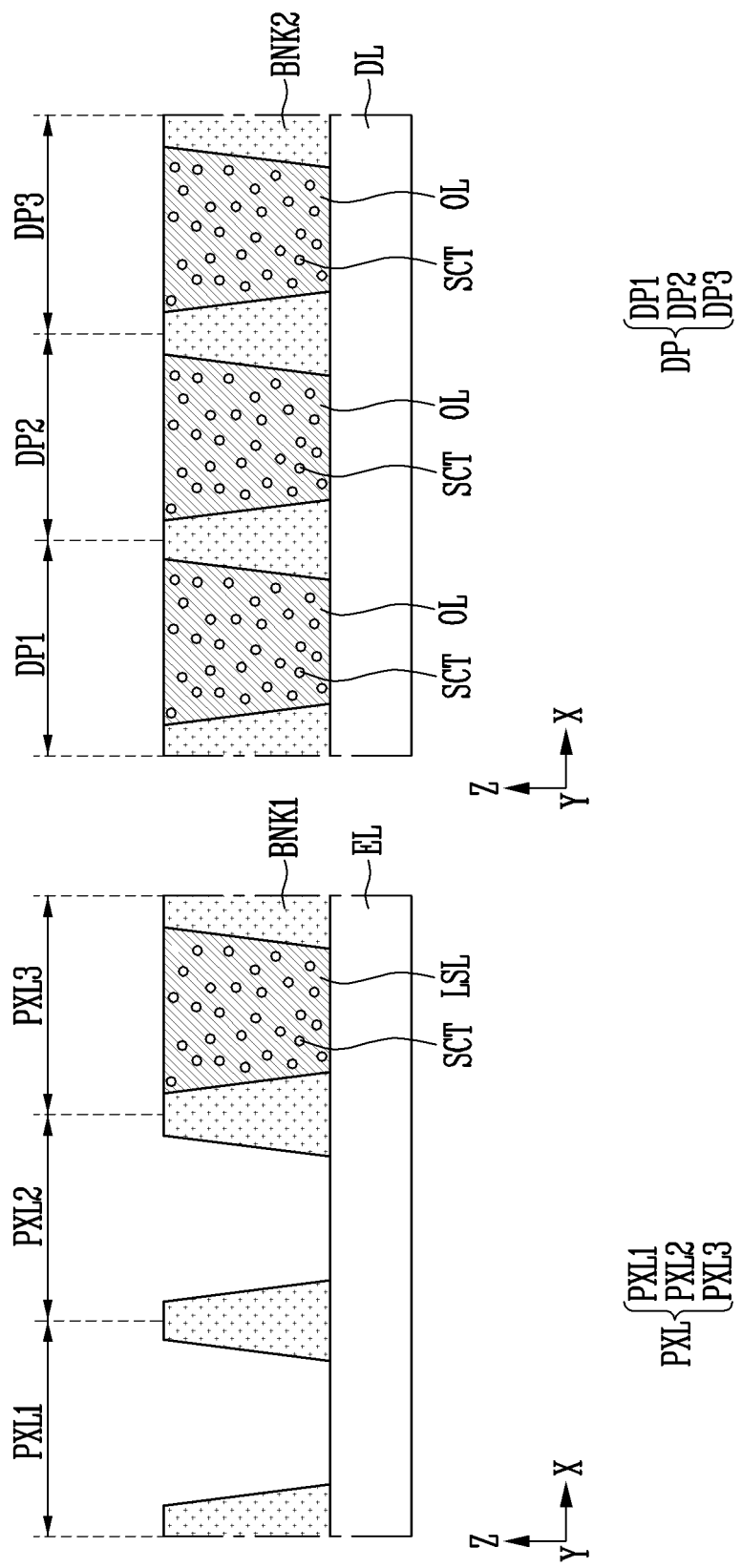

Referring to FIG. 13, subsequently, the scattering layer LSL and the organic layer OL may be formed.

The scattering layer LSL may be formed in the opening of the first bank BNK1 of the third sub-pixel PXL3. The organic layer OL may be formed in each of the openings of the second bank BNK2 of the first to third dummy pixels DP1, DP2, and DP3. As described above, as the organic layer OL may be provided in the opening of the second bank BNK2 of the dummy pixels DP, the step difference due to the second bank BNK2 may be minimized. Accordingly, as described above, cracks may be prevented from occurring in the optical layer OPL during the rework process of the light-transmitting film FLM, thereby minimizing the peeling phenomenon.

The scattering layer LSL and the organic layer OL may be simultaneously formed in a same process. As described above, in case that the scattering layer LSL and the organic layer OL are simultaneously formed, an additional process for providing the organic layer OL to the dummy pixels DP may be unnecessary, and thus the manufacturing process of the display device may be simplified.

Since the scattering layer LSL and the organic layer OL are described in detail with reference to FIGS. 7 and 9, a repetitive description is omitted.

Figure 14:
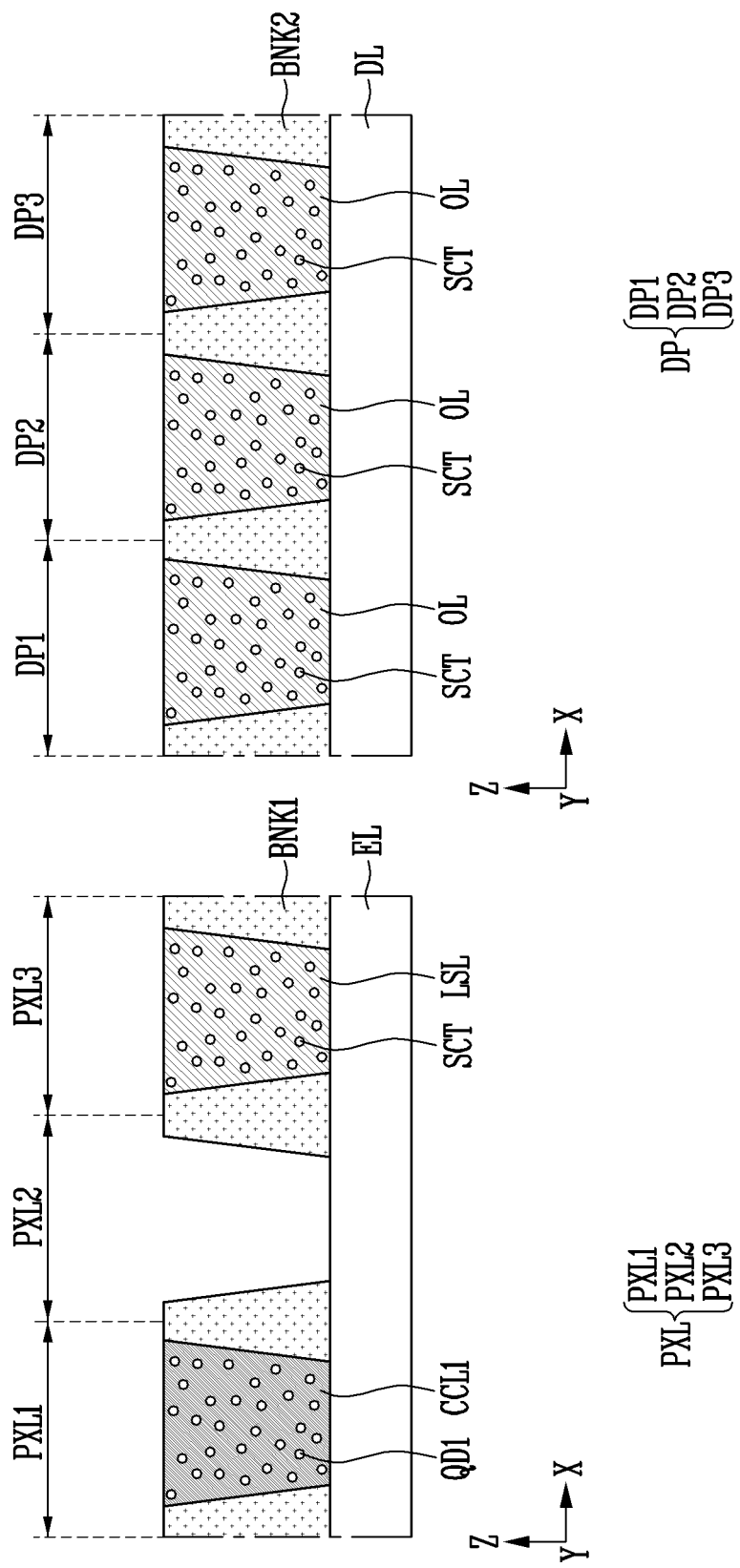

Referring to FIG. 14, subsequently, the first color conversion layer CCL1 may be formed.

The first color conversion layer CCL1 may be formed in the opening of the first bank BNK1 of the first sub-pixel PXL1. Since the first color conversion layer CCL1 is described in detail with reference to FIG. 7, a repetitive description is omitted.

Figure 15:
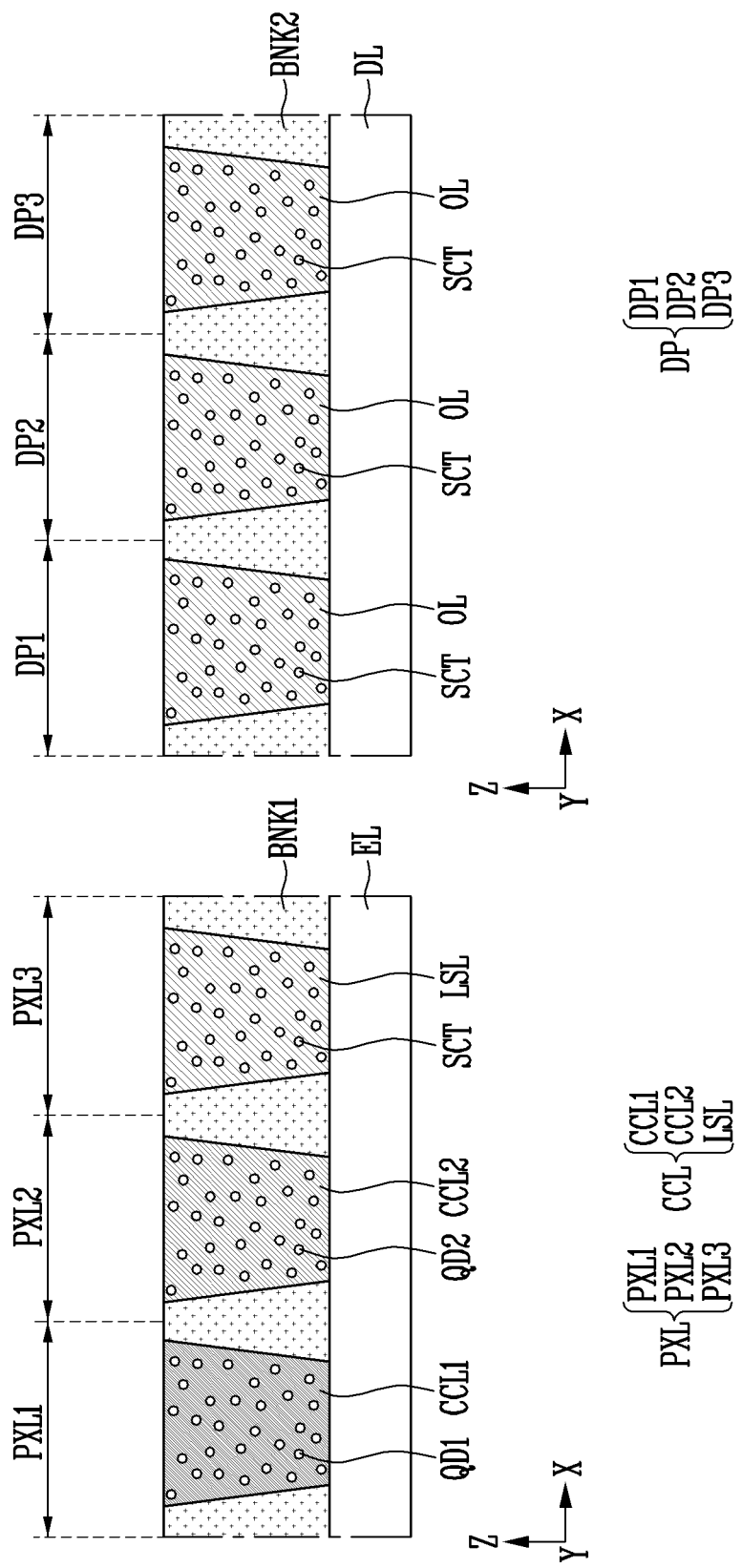

Referring to FIG. 15, subsequently, the second color conversion layer CCL2 may be formed.

The second color conversion layer CCL2 may be formed in the opening of the first bank BNK1 of the second sub-pixel PXL2. Since the second color conversion layer CCL2 is described in detail with reference to FIG. 7, a repetitive description is omitted.

In FIGS. 13 to 15, a case where the scattering layer LSL, the organic layer OL, the first color conversion layer CCL1, and the second color conversion layer CCL2 are sequentially formed is illustrated, but a process sequence is not limited thereto, and may be variously changed according to process environment and condition.

Figure 16:
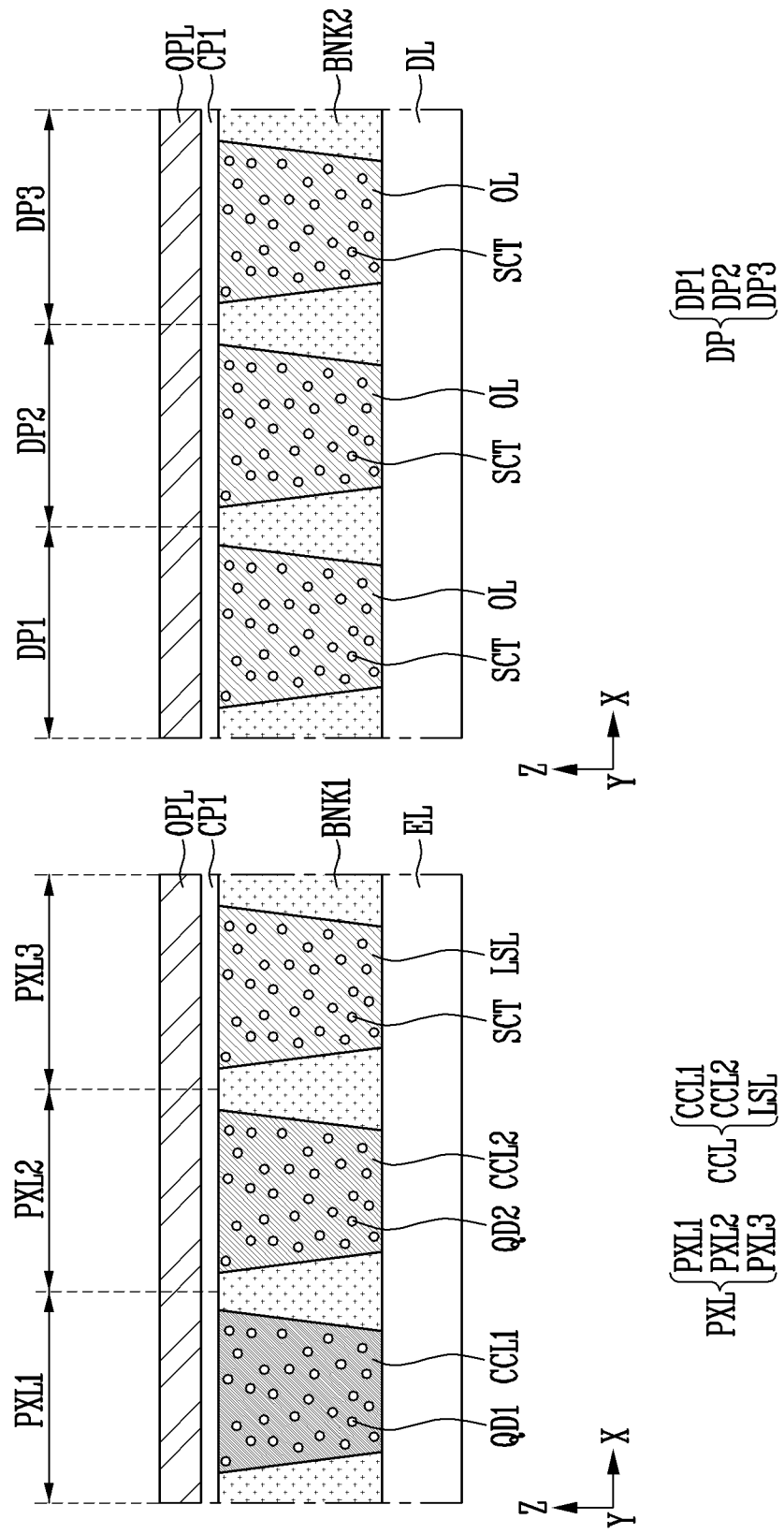

Referring to FIG. 16, subsequently, the first capping layer CP1 may be formed, and the optical layer OPL may be formed on the first capping layer CP1. The first capping layer CP1 and the optical layer OPL may be formed over the first to third sub-pixels PXL1, PXL2, and PXL3 and the first to third dummy pixels DP1, DP2, and DP3. As described above, even though the optical layer OPL may be formed in the dummy pixels DP, since the step difference of the second bank BNK2 may be minimized by the organic layer OL, cracks may be prevented from occurring in the optical layer OPL during the rework process as described above.

Since the first capping layer CP1 and the optical layer OPL are described in detail with reference to FIGS. 7 and 9, a repetitive description is omitted.

Figure 17:
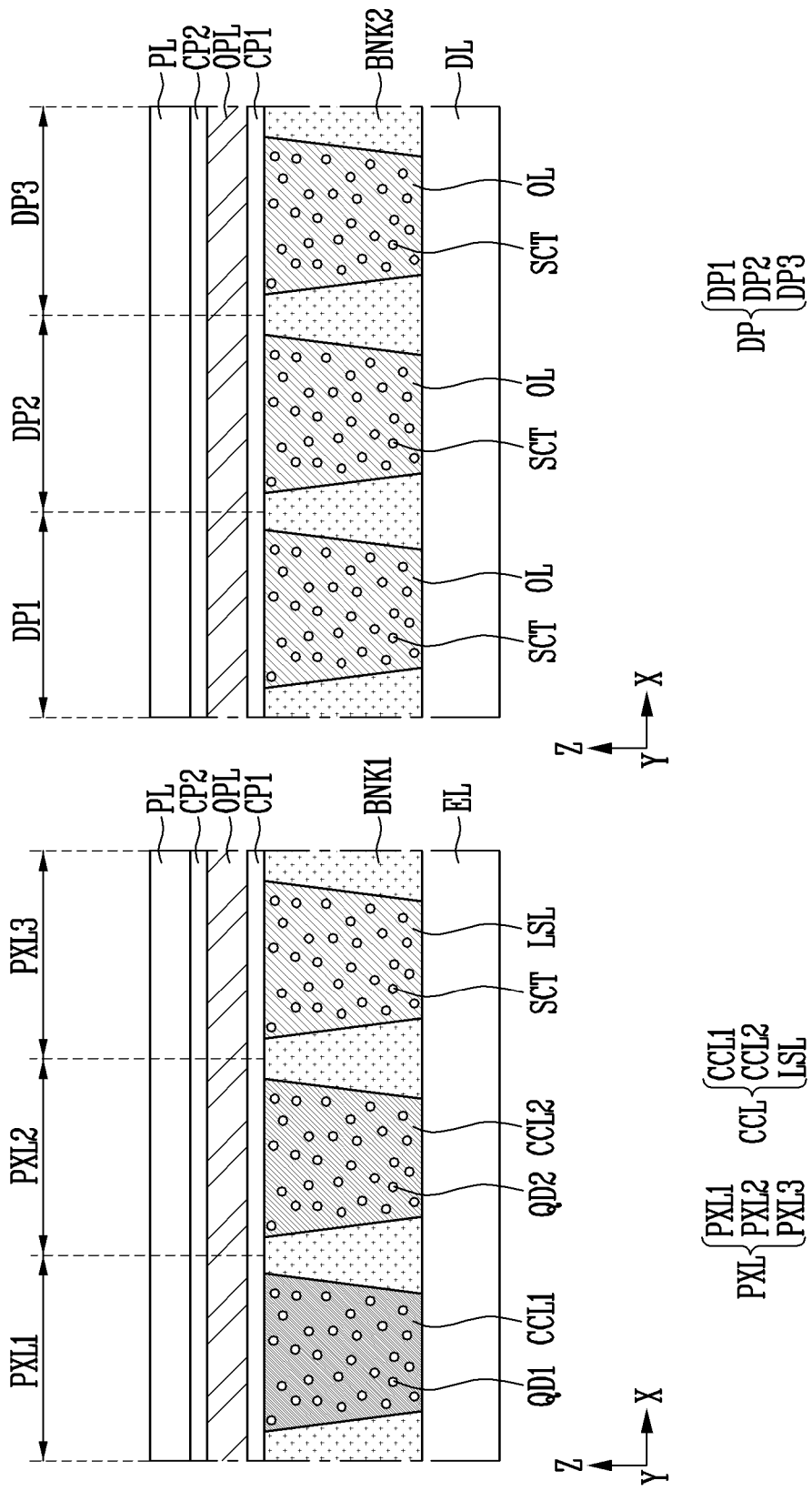

Referring to FIG. 17, subsequently, the second capping layer CP2 may be formed, and the planarization layer PL may be formed on the second capping layer CP2. The second capping layer CP2 and the planarization layer PL may be formed over the first to third sub-pixels PXL1, PXL2, and PXL3 and the first to third dummy pixels DP1, DP2, and DP3. Since the second capping layer CP2 and the planarization layer PL are described in detail with reference to FIGS. 7 and 9, a repetitive description is omitted.

Figure 18:
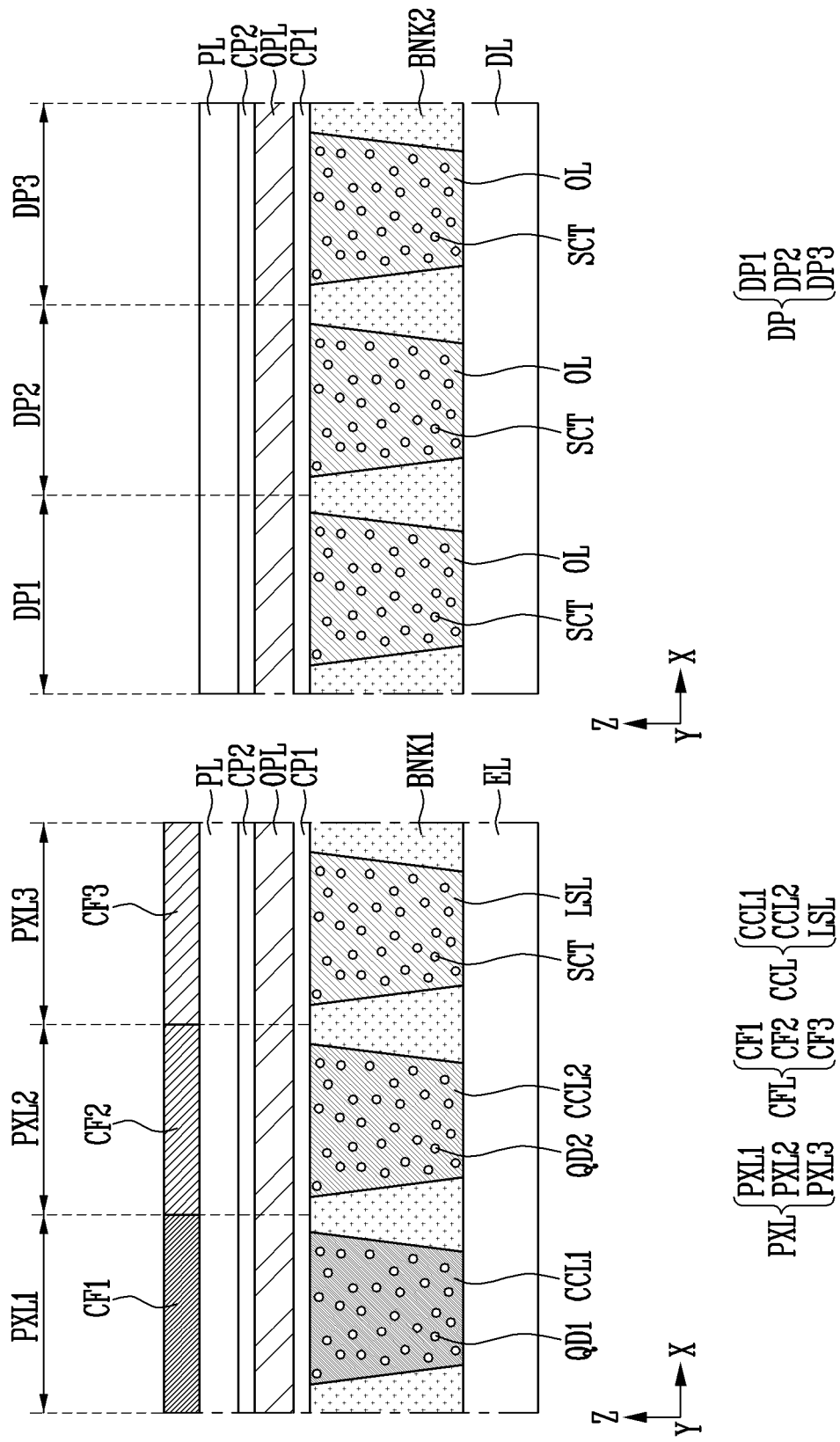

Referring to FIG. 18, subsequently, the color filter layer CFL may be formed. The color filter layer CFL may include the first color filter CF1 formed in the first sub-pixel PXL1, the second color filter CF2 formed in the second sub-pixel PXL2, and the third color filter CF3 formed in the third sub-pixel PXL3. Since the color filter layer CFL is described in detail with reference to FIG. 7, a repetitive description is omitted.

Figure 19:
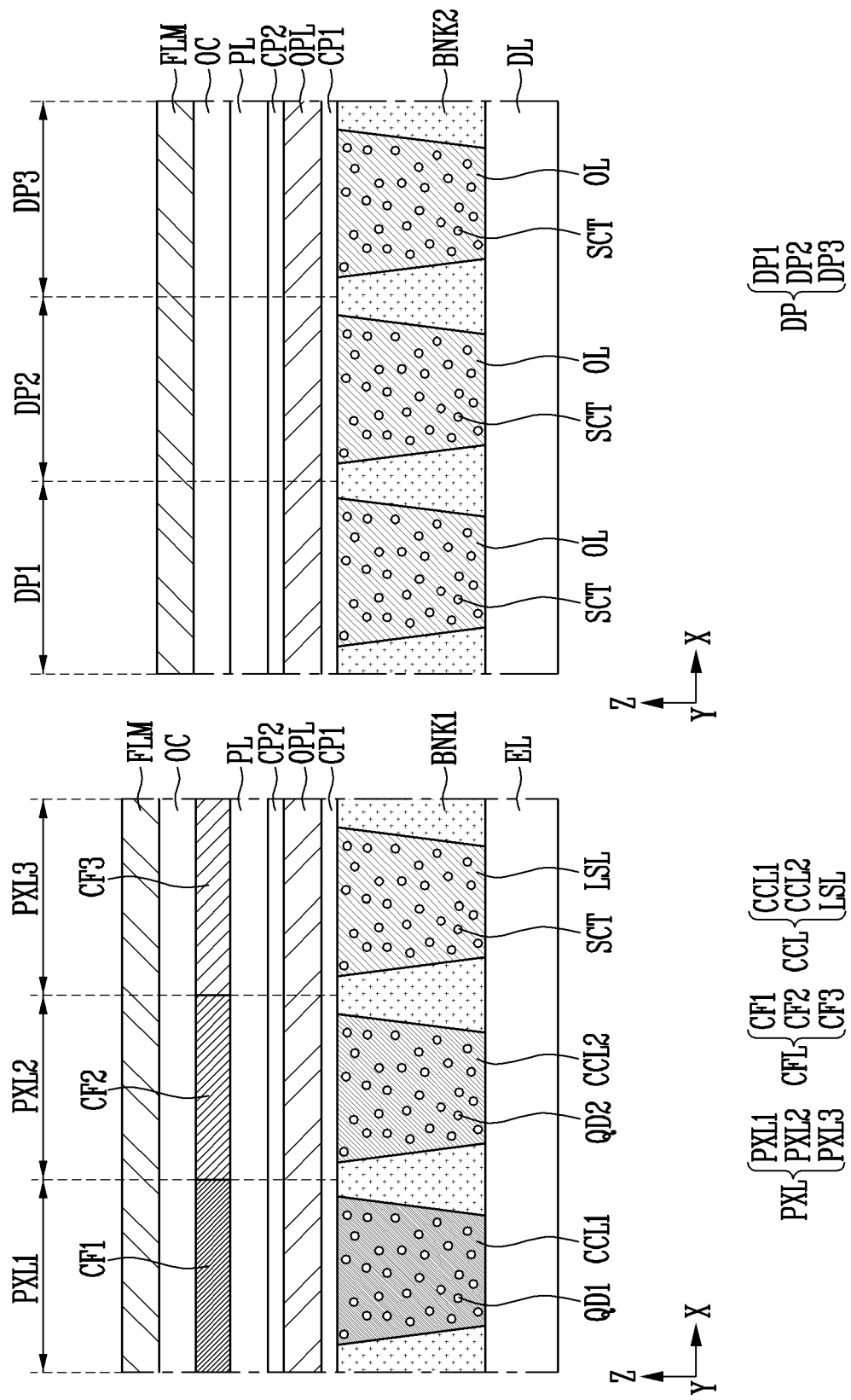

Referring to FIG. 19, subsequently the overcoat layer OC and the light-transmitting film FLM are formed, and thus the display device of FIGS. 7 and 9 may be completed. The overcoat layer OC and the light-transmitting film FLM may be formed over the first to third sub-pixels PXL1, PXL2, and PXL3 and the first to third dummy pixels DP1, DP2 and DP3.

In an embodiment, even though the light-transmitting film FLM may be reworked, since the lower step difference may be minimized as the organic layer OL may be provided in the opening of the second bank BNK2 of the dummy pixels DP, the peeling phenomenon may be minimized by preventing cracks from occurring in the optical layer OPL during the rework process.

Since the overcoat layer OC and the light-transmitting film FLM are described in detail with reference to FIGS. 7 and 9, a repetitive description is omitted.

Those skilled in the art may understand that the disclosure may be implemented in modified forms without departing from the spirit of the above-described embodiments. Therefore, the disclosed embodiments should be considered in a descriptive sense and not by way of limitation.

What is claimed is:

1. A display device comprising:
   sub-pixels disposed in a display area;
   dummy pixels disposed in a non-display area;
   a first bank disposed at a boundary between the sub-pixels and including an opening;
   a second bank disposed at a boundary between the dummy pixels and including an opening;
   a color conversion layer disposed in the opening of the first bank; and
   an organic layer disposed in the opening of the second bank, wherein
   each of the sub-pixels comprises:
   a first electrode and a second electrode spaced apart from each other;
   light emitting elements between the first electrode and the second electrode;
   a first connection electrode disposed on first ends of the light emitting elements; and
   a second connection electrode disposed on second ends of the light emitting elements.

2. The display device according to claim 1, wherein a thickness of the organic layer is less than a thickness of the color conversion layer.

3. The display device according to claim 2, wherein a difference between a thickness of the second bank and a thickness of the organic layer is about 5 μm or less.

4. The display device according to claim 1, wherein the color conversion layer is disposed on the light emitting elements.

5. The display device according to claim 1, wherein the sub-pixels comprise:
a first pixel emitting a first color;
a second pixel emitting a second color; and
a third pixel emitting a third color.

6. The display device according to claim 5, wherein the color conversion layer comprises:
a first color conversion layer disposed in the first pixel;
a second color conversion layer disposed in the second pixel; and
a scattering layer disposed in the third pixel.

7. The display device according to claim 6, wherein the organic layer and the scattering layer include a same material.

8. The display device according to claim 7, wherein the organic layer and the scattering layer are disposed on a same layer.

9. The display device according to claim 6, wherein at least one of the first color conversion layer and the second color conversion layer includes a base resin and a quantum dot dispersed in the base resin.

10. The display device according to claim 1, further comprising:
a dam disposed in the non-display area,
wherein the dam surrounds the display area.

11. The display device according to claim 10, wherein the dam, the first bank, and the second bank include a same material.

12. The display device according to claim 10, further comprising:
a pad area disposed in the non-display area,
wherein the dam is disposed between the dummy pixels and the pad area.

* * * * *